US007973695B2

(12) United States Patent
Kudo

(10) Patent No.: US 7,973,695 B2
(45) Date of Patent: Jul. 5, 2011

(54) ELECTRONIC APPARATUS, AD CONVERTER, AND AD CONVERSION METHOD

(75) Inventor: Shigetaka Kudo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/659,802

(22) Filed: Mar. 22, 2010

(65) Prior Publication Data

US 2010/0253560 A1  Oct. 7, 2010

(30) Foreign Application Priority Data

Apr. 3, 2009 (JP) ............................... P2009-090764
Mar. 1, 2010 (JP) ............................... P2010-044532

(51) Int. Cl.
*H03M 1/56* (2006.01)
(52) U.S. Cl. .................... 341/169; 341/155; 341/164
(58) Field of Classification Search .................. 341/155, 341/164, 169
See application file for complete search history.

(56) References Cited

U.S. PATENT DOCUMENTS

| 5,877,715 | A  | * | 3/1999 | Gowda et al. ................. 341/122 |
| 5,920,274 | A  | * | 7/1999 | Gowda et al. ................. 341/155 |
| 6,727,486 | B2 | * | 4/2004 | Choi .......................... 250/208.1 |
| 7,129,883 | B2 | * | 10/2006 | Muramatsu et al. .......... 341/164 |
| 7,148,831 | B2 | * | 12/2006 | Krymski ....................... 341/155 |
| 7,227,488 | B2 | * | 6/2007 | Cho ............................. 341/155 |
| 7,256,724 | B2 | * | 8/2007 | Lee ............................. 341/169 |
| 7,324,033 | B2 | * | 1/2008 | Asayama et al. ............. 341/145 |
| 7,379,011 | B2 | * | 5/2008 | Ham et al. .................... 341/170 |
| 2005/0195238 | A1 | | 9/2005 | Eguchi et al. |

FOREIGN PATENT DOCUMENTS

JP  2005-323331  11/2005

* cited by examiner

*Primary Examiner* — Khai M Nguyen
(74) *Attorney, Agent, or Firm* — Rader, Fishman & Grauer PLLC

(57) ABSTRACT

An electronic apparatus includes: an AD conversion section that has a comparing section, which receives a reference signal whose level changes gradually from a reference signal generating section that generates the reference signal and which compares the reference signal with an analog signal to be processed, and a counter section, which receives a count clock for AD conversion and performs a count operation on the basis of a comparison result of the comparing section, and that acquires digital data of the signal to be processed on the basis of output data of the counter section; a count operation period control section that controls an operation period of the counter section in each processing period on the basis of the comparison result of the comparing section; and a driving control section that controls the reference signal generating section and the AD conversion section.

12 Claims, 12 Drawing Sheets

FIG.2B
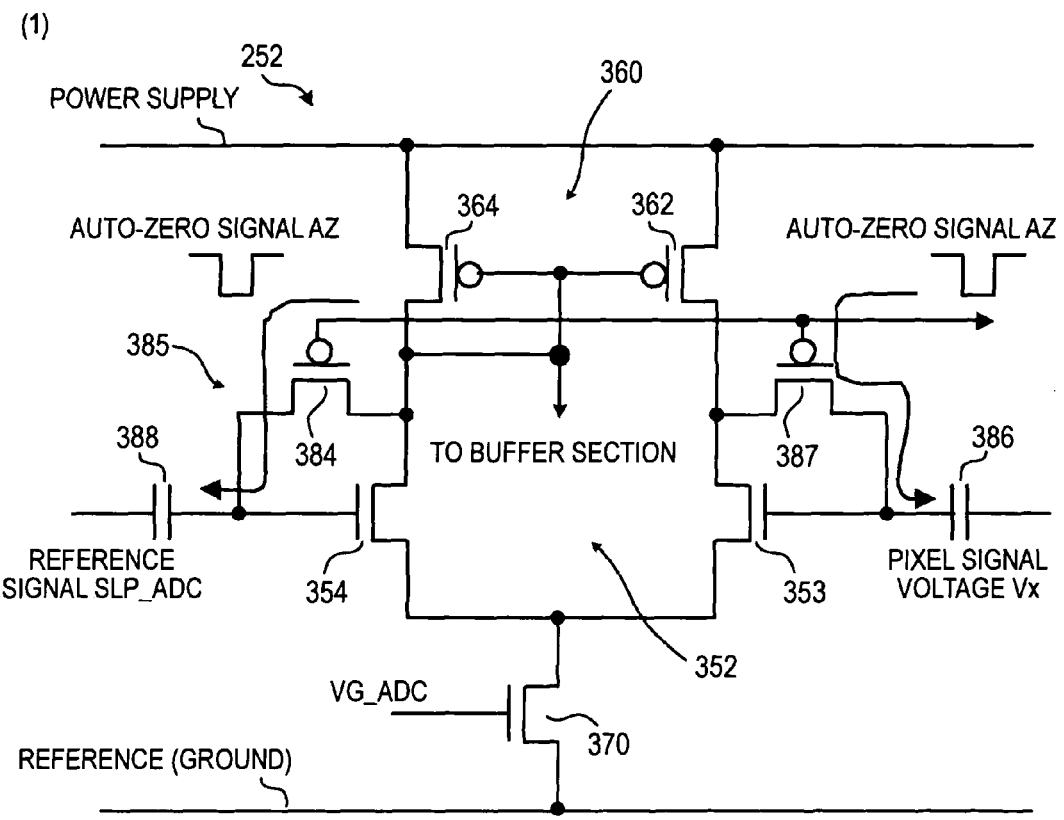
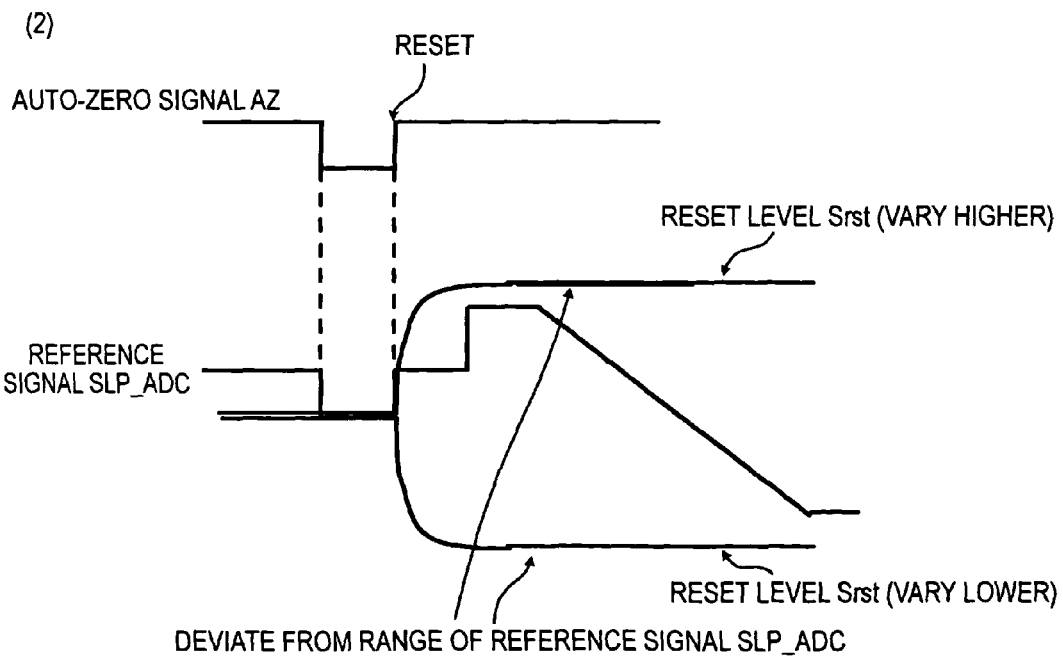

FIG.4A
(1) RELATIONSHIP BETWEEN INCLINATION OF REFERENCE SIGNAL SLP_ADC, FREQUENCY OF COUNT CLOCK CKcnt1, AND BIT RESOLUTION
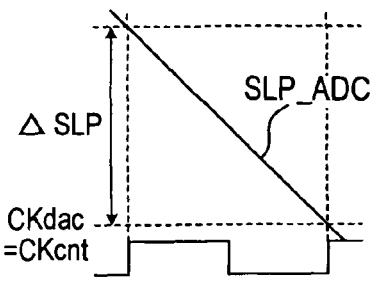
(2) INCLINATION OF REFERENCE SIGNAL SLP_ADC IS CHANGED AND FREQUENCY OF COUNT CLOCK CKcnt IS FIXED
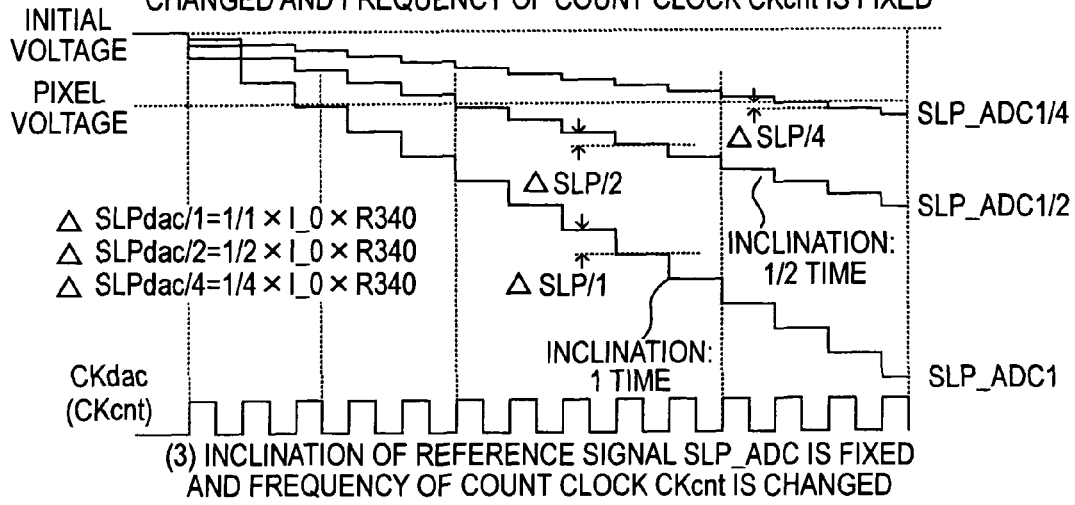
(3) INCLINATION OF REFERENCE SIGNAL SLP_ADC IS FIXED AND FREQUENCY OF COUNT CLOCK CKcnt IS CHANGED
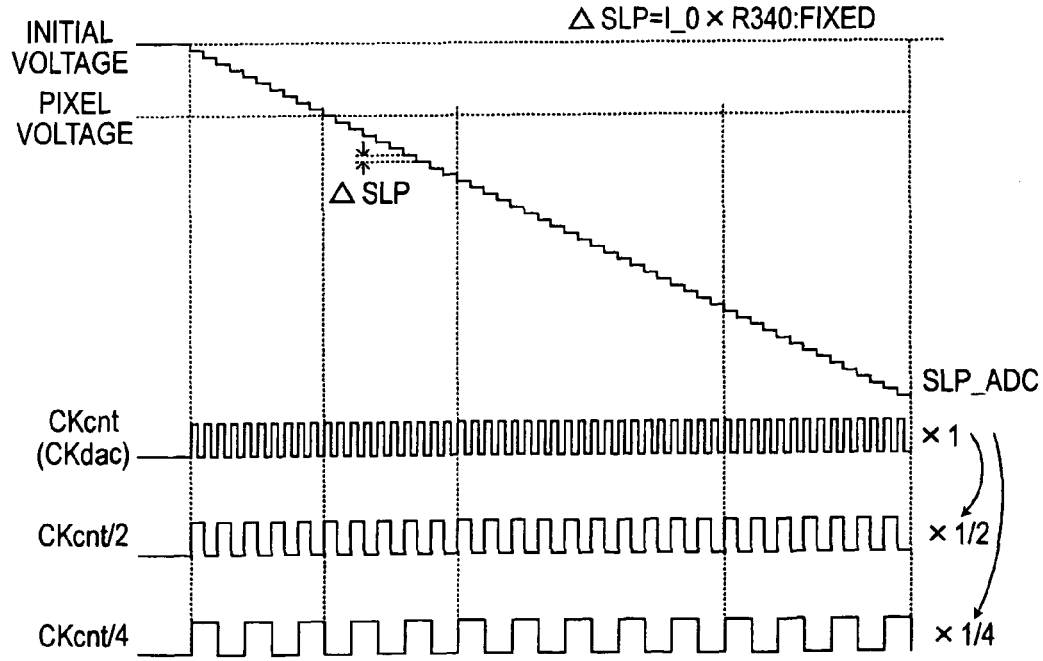

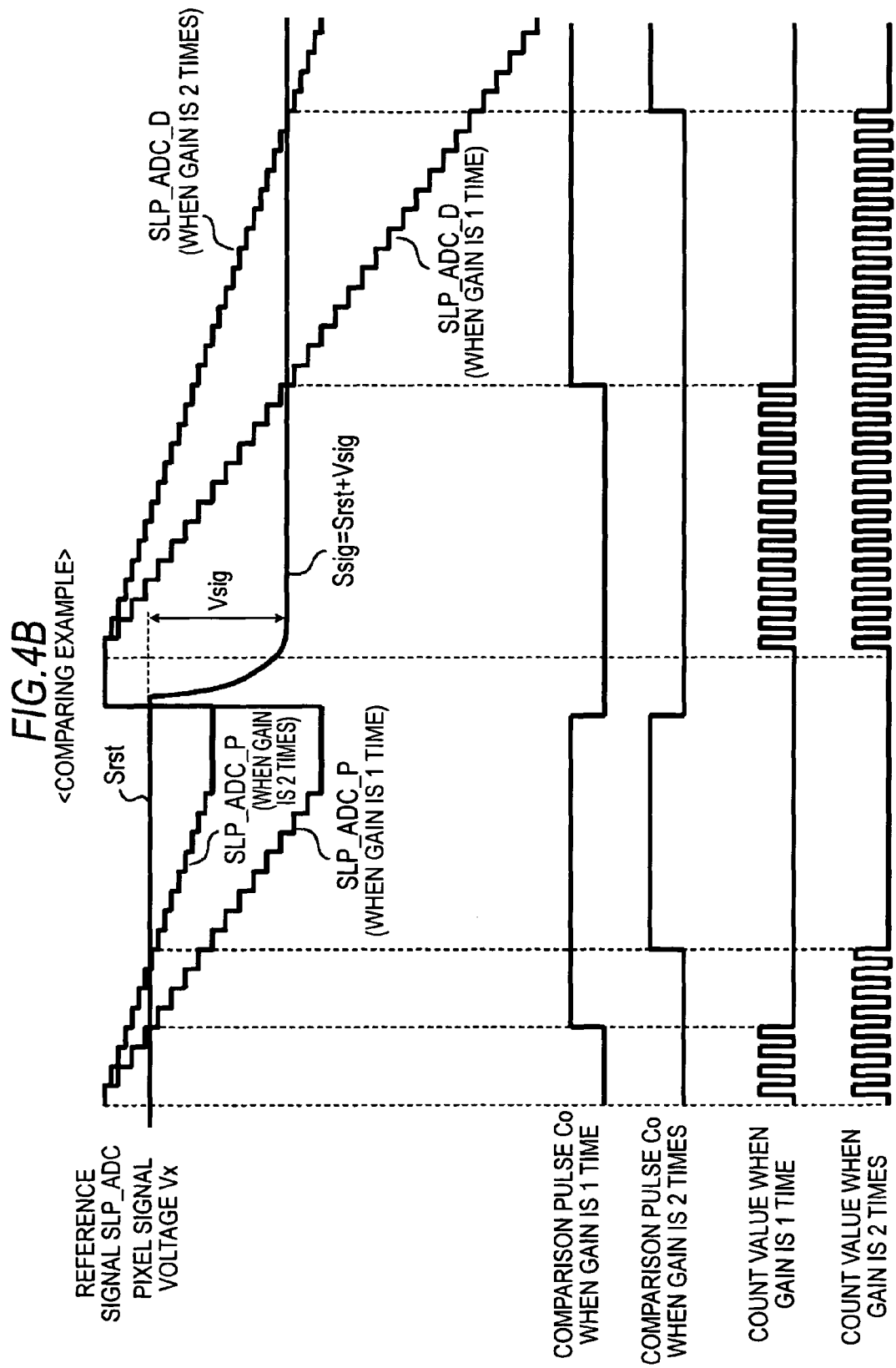

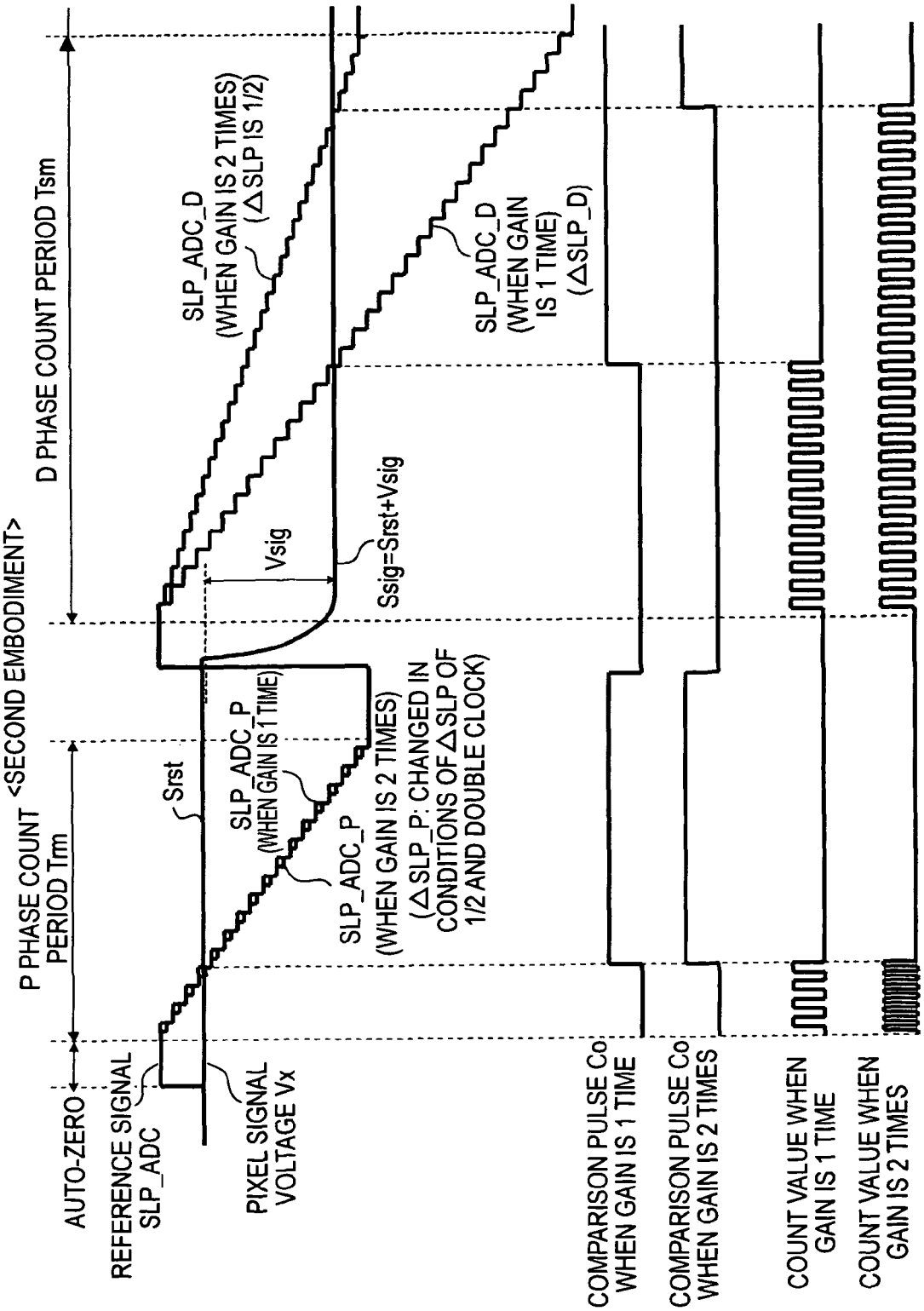

FIG.6B
(1)
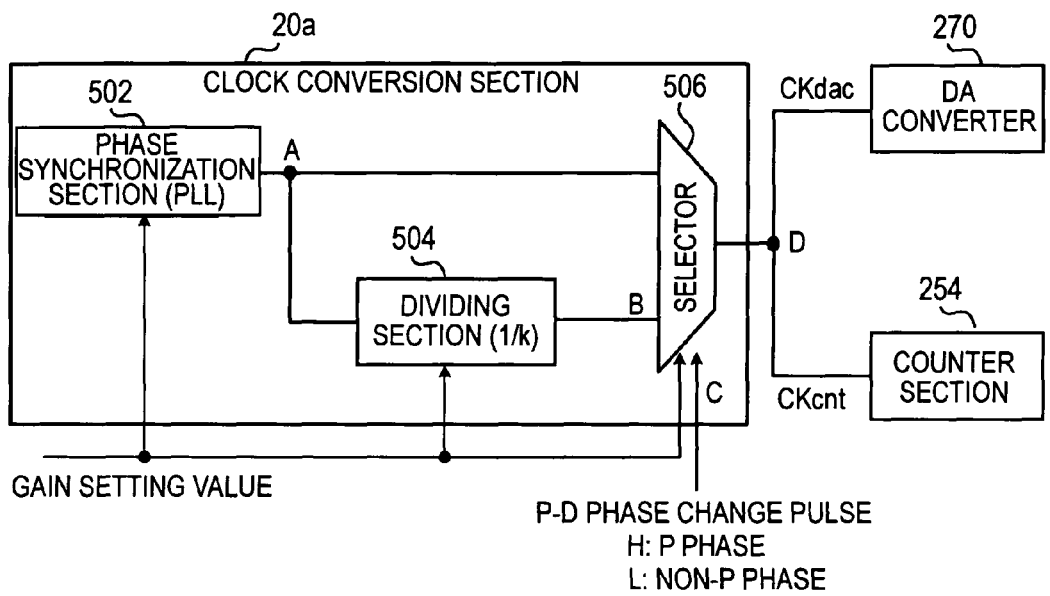
(2) WHEN k=2
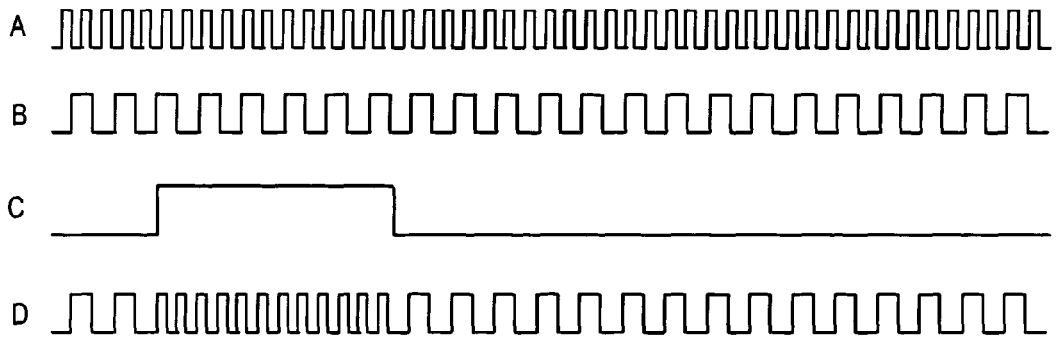

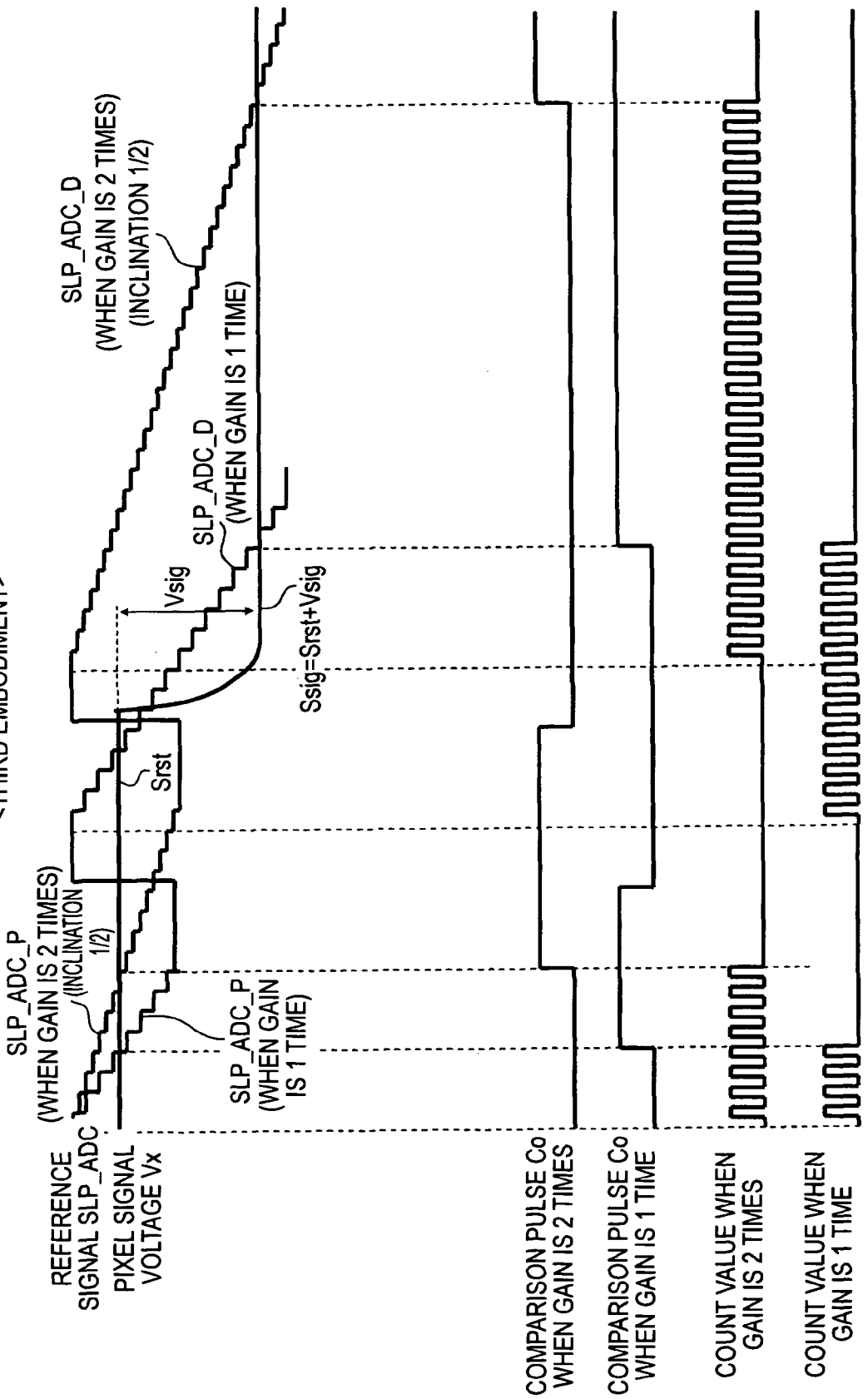

ELECTRONIC APPARATUS, AD CONVERTER, AND AD CONVERSION METHOD

BACKGROUND OF THE INVENTION

1. Field of the Invention

The present invention relates to an electronic apparatus, such as a solid state imaging device or an imaging apparatus, an AD converter, and an AD conversion method.

2. Description of the Related Art

In an electronic apparatus, an analog signal is often converted into digital data (called AD conversion). A difference between two analog signals (voltage levels) maybe converted into digital data. As an AD conversion method, various methods may be considered in terms of circuit size, processing speed (improvement in the speed), resolution, and the like. As an example, there is a reference signal comparing type AD conversion method (see JP-A-2005-323331). In addition, the reference signal comparing type is also called a slope integration type or a ramp signal comparing type.

In the reference signal comparing type AD conversion method, a reference signal whose value changes gradually is used for voltage comparison for conversion into digital data. In addition, an analog signal to be processed is compared with the reference signal, and the digital data of the signal to be processed is acquired on the basis of the count value obtained by performing count processing in a count operation effective period based on the comparison processing result.

JP-A-2005-323331 discloses an example in which the reference signal comparing type AD conversion method is applied to a solid state imaging device or an imaging apparatus. In performing CDS processing by calculating the difference between a signal level and a reset level at the pixel signal voltage, the CDS processing is simultaneously performed at the time of reference signal comparing type AD conversion. By acquiring the digital data as a result of the difference between the reset level and the signal level, digital data of a signal component from which noise has been removed is acquired.

In the method disclosed in JP-A-2005-323331, the total AD conversion period is shortened by setting the count period of the reset level to be shorter than that of the signal level while maintaining the inclination (rate of change) of a reference signal constant for both the reset level and the signal level.

SUMMARY OF THE INVENTION

In the method disclosed in JP-A-2005-323331, however, the amplitude (AD conversion range) of the reference signal in the count period of the reset level becomes narrower than the amplitude of the reference signal in the count period of the signal level. Accordingly, also in connection with factors, such as noise included in the reset level or voltage change in initial setting of comparison processing, the reset level deviates from the amplitude of the reference signal. As a result, there has been a case in which it is difficult to perform the AD conversion processing properly.

Therefore, it is desirable to provide a structure capable of solving the problem that a signal level to be processed deviates from the AD conversion range in acquiring the digital data, which corresponds to a difference between two signal levels, using a reference signal comparing type AD conversion method and accordingly it becomes difficult to perform AD conversion processing properly.

According to a first embodiment of the present invention, the inclination of a reference signal per unit time in a processing period of a reference side supplied for differential processing is set to be larger than that in a processing period of a side including a difference acquired in the differential processing.

In the processing period of the reference side, a count period is equal to that in the case where the first embodiment is not applied, but the inclination of a reference signal becomes larger than that in the case where the first embodiment is not applied. As a result, in the processing period of the reference side, the AD conversion range is extended more than that in the case where the first embodiment is not applied.

According to a second embodiment of the present invention, a processing period of a reference side supplied for differential processing is changed according to a set value of an AD conversion gain. A frequency of a count clock for AD conversion in a processing period of the reference side and a processing period of the side including the difference acquired in the differential processing is set constant regardless of the set value of the AD conversion gain. The inclination of the reference signal per unit time in the processing period of the reference side is set to be equal to the inclination of the reference signal per unit time in the processing period of the side including the difference regardless of the set value of the AD conversion gain.

In the processing period of the reference side, the count clock for AD conversion is equal to that in the case where the second embodiment is not applied, but the count period becomes longer according to the set value of the AD conversion gain than that in the case where the second embodiment is not applied. As a result, in the processing period of the reference side, the AD conversion range is extended more than that in the case where the second embodiment is not applied.

According to the embodiments of the present invention, since the AD conversion range extends compared with the case where the first and second embodiments are not applied, it is possible to solve the problem that the level of a signal to be processed deviates from the AD conversion range.

BRIEF DESCRIPTION OF THE DRAWINGS

FIG. 2B is a view illustrating the configuration and operation of an input stage of a comparing section;

FIG. 4A is a view illustrating the relationship of the bit resolution, the inclination of a reference signal, and an AD clock;

FIG. 4B is a view illustrating AD conversion gain change (when the gain is 1 time and 2 times);

FIG. 6A is a timing chart illustrating an operation in a second embodiment;

FIG. 6B is a view showing a clock supplying method for realizing the second embodiment;

FIG. 7 is a timing chart illustrating an operation in a third embodiment; and

DESCRIPTION OF THE PREFERRED EMBODIMENTS

Hereinafter, embodiments of the present invention will be described in detail with reference to the accompanying drawings.

The explanation will be performed in following order.
1. Basic configuration and operation of a solid state imaging device
2. First embodiment (solid state imaging device: P phase range is increased under conditions where a count period is not changed: all the time)
3. Second embodiment (solid state imaging device: P phase range is increased under conditions where a count period is not changed: in association with a gain)
4. Third embodiment (solid state imaging device: P phase range is increased under conditions where a count period is changed: in association with a gain)
5. Fourth embodiment (application to an imaging apparatus)
<Solid State Imaging Device: Basic Configuration and Operation>

Figure 1:
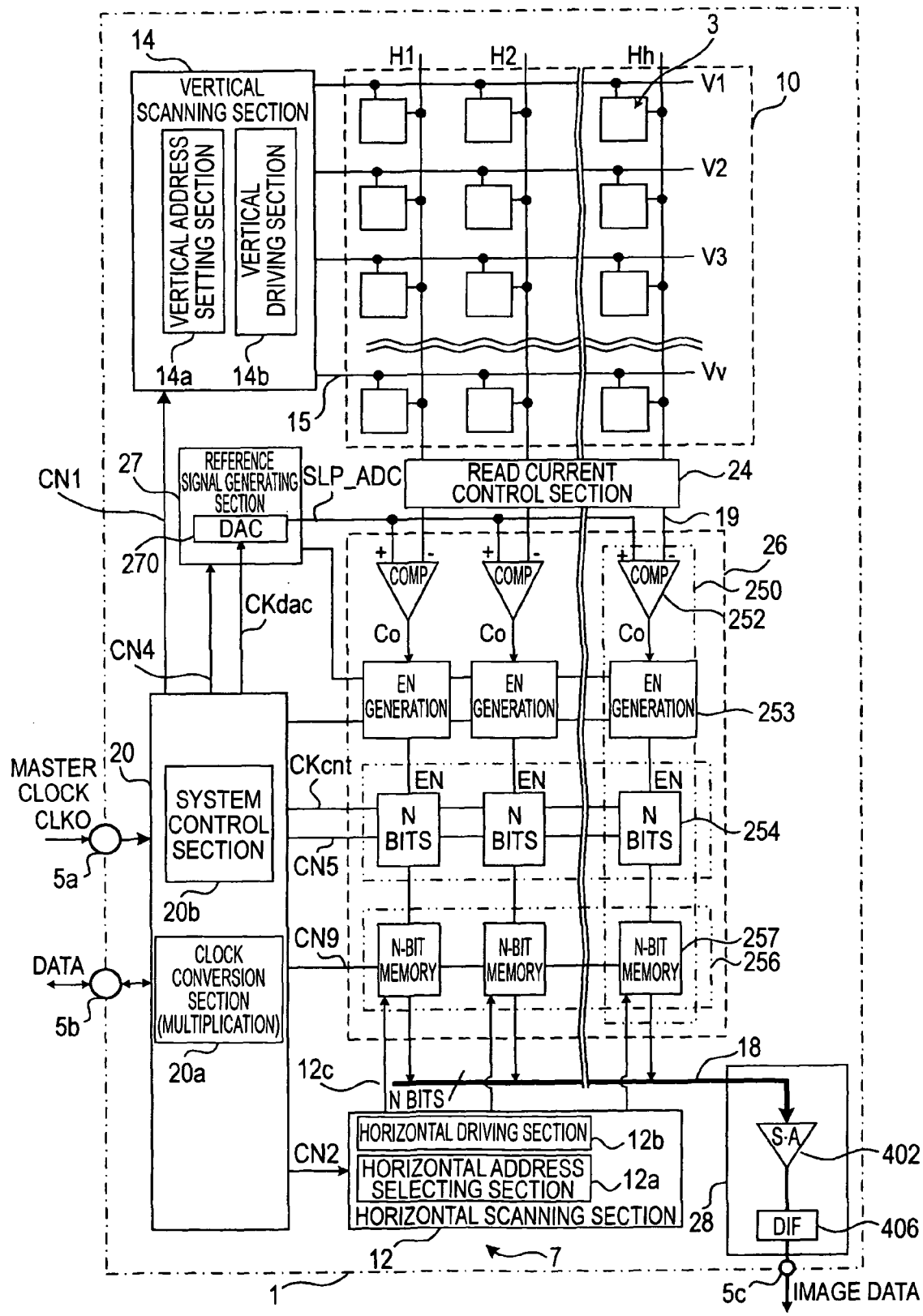
FIG. 1 is a view showing the basic configuration of a CMOS type solid state imaging device.

FIG. 1 is a view showing the basic configuration of a CMOS type solid state imaging device (CMOS image sensor) which is an embodiment of a solid state imaging device. The solid state imaging device is also an example of a semiconductor device.

A solid state imaging device 1 includes a pixel array section 10 in which a plurality of unit pixels 3 are arrayed in a two-dimensional matrix. In FIG. 1, rows and columns are shown in a state where parts of the rows and columns are omitted, for the sake of simplicity. In practice, however, tens to thousands of unit pixels 3 are arrayed in each row or each column. From the unit pixel 3, a pixel signal voltage Vx is output through a vertical signal line 19 for every column.

In the pixel signal voltage Vx of the vertical signal line 19, a signal level Ssig appears after a reset level Srst including noise of a pixel signal as a reference level in a time-sequence manner. The signal level Ssig is a level obtained by adding a signal component Vsig to the reset level Srst, and the signal component Vsig can be obtained by Ssig(=Srst+Vsig)−Srst.

In addition, the solid state imaging device 1 includes a column AD conversion section 26 in which AD conversion sections 250, each of which performs CDS (Correlated Double Sampling) processing or digital conversion, are provided in column parallel.

In addition, the solid state imaging device 1 includes a driving control section 7, a read current control section 24 which supplies to the unit pixel 3 an operating current (read current) for pixel signal read, a reference signal generating section 27 which supplies to the column AD conversion section 26 a reference signal SLP_ADC for AD conversion, and an output section 28.

The driving control section 7 includes a horizontal scanning section 12 (column scanning circuit), a vertical scanning section 14 (row scanning circuit), and a communication and timing control section 20 for realizing a control circuit function for sequentially reading signals of the pixel array section 10. The horizontal scanning section 12 designates the column position of data to be read at the time of data transfer operation.

The horizontal scanning section 12 has a horizontal address setting section 12a or a horizontal driving section 12b which controls a column address or column scanning. The vertical scanning section 14 has a vertical address setting section 14a or a vertical driving section 14b which controls a row address or row scanning. The horizontal scanning section 12 and the vertical scanning section 14 start scanning of rows and columns in response to control signals CN1 and CN2 from the communication and timing control section 20.

The communication and timing control section 20 includes a functional block of a timing generator (an example of a read address control device) which supplies a clock, which is synchronized with a master clock CLK0 input through a terminal 5a, to each section (scanning sections 12 and 14 or the column AD conversion section 26) in the device. In addition, the communication and timing control section 20 includes a functional block of a communication interface that receives the master clock CLK0 supplied from an external main control section through the terminal 5a and receives data, which commands an operation mode or the like supplied from the external main control section through a terminal 5b and that outputs data including the information on the solid state imaging device 1 to the external main control section.

The communication and timing control section 20 has a clock conversion section 20a, which is an example of a clock converter that generates an internal clock, and a system control section 20b which has a communication function or a function of controlling the timing of each section. The clock conversion section 20a has a multiplication circuit, which generates a pulse with a higher frequency than the master clock CLK0 on the basis of the master clock CLK0 input through the terminal 5a, and generates an internal clock, such as an AD clock CKcnt or a DAC clock CKdac.

The output section 28 has a signal amplification section 402 (S·A) and a digital interface section 406 (DIF). The output section 28 also includes other functional sections for reducing power consumption in a standby state, which will be described later. The signal amplification section 402 detects a signal (with small amplitude even though it is digital data) on a horizontal signal line 18 which is a signal line for data transfer (transfer wiring line).

The digital interface section 406 is interposed between the signal amplification section 402 and an external circuit and has a function of interface with an external circuit. An output of the digital interface section 406 is connected to an output end 5c, and the image data are output to a subsequent-stage circuit.

The unit pixel 3 is connected to the vertical scanning section 14 through a row control line 15 for row selection and connected to the AD conversion section 250, which is provided for every vertical column of the column AD conversion section 26, through the vertical signal line 19. The row control line 15 indicates all wiring lines extending from the vertical scanning section 14 to pixels.

The vertical scanning section 14 selects a row of the pixel array section 10 and supplies the pulse necessary for the row. The vertical address setting section 14a selects not only a row through which a signal is read (read row; also called a selection row or a signal output row) but also a row for an electronic shutter and the like.

As an AD conversion method in the AD conversion section 250, various methods may be considered in terms of circuit size, processing speed (improvement in the speed), resolution, and the like. As an example, an AD conversion method called a reference signal comparing type AD conversion method, a slope integration type AD conversion method, or a ramp signal comparing type AD conversion method is adopted. This method has a feature such that the circuit size is not increased even if it is provided in parallel, since an AD converter can be realized with a simple configuration. In the reference signal comparing type AD conversion, a count operation effective period Ten (here, a count enable signal EN indicating the period) is determined on the basis of a time from the start of conversion (start of comparison processing) to the end of conversion (end of comparison processing), and a signal to be processed is converted into digital data on the basis of the clock number of the period.

When the reference signal comparing type AD conversion method is adopted, it may also be considered to provide the reference signal generating section 27 in column parallel (for every pixel column). For example, there is a case of adopting the configuration where a comparator and a reference signal generator are provided in each pixel column and the value of a reference signal is sequentially changed on the basis of a comparison result of the comparator in its own column by the reference signal generator of the corresponding column. In this case, however, circuit size or power consumption increases. Therefore, in the present embodiment, a configuration is adopted in which the reference signal generating section 27 is used in common in all columns and the reference signal SLP_ADC generated by the reference signal generating section 27 is used in common by the AD conversion section 250 of each pixel column.

Accordingly, the reference signal generating section 27 has a DA converter 270 (DAC; Digital Analog Converter). The DA converter 270 generates the reference signal SLP_ADC with inclination (rate of change), which is indicated by control data CN4 from the communication and timing control section 20, from the initial value indicated by the control data CN4 in synchronization with the DAC clock CKdac. It is preferable that the reference signal SLP_ADC has a waveform which has a predetermined inclination on the whole and changes linearly. The reference signal SLP_ADC may change in a smooth slope shape or may change sequentially in a stepwise manner.

In the reference signal comparing type AD conversion, the count operation effective period Ten (signal indicating the period is a count enable signal EN) is determined on the basis of a comparison result of the reference signal SLP_ADC and the pixel signal voltage Vx using the comparing section 252, and the analog signal to be processed is converted into digital data on the basis of the clock number of the AD clock CKcnt in a period where the count enable signal EN is active.

Processing regarding the reference level (reset level Srst) is called processing of a precharge phase (may be abbreviated to a P phase), and processing regarding the signal level Ssig is called processing of a data phase (may be abbreviated to a D phase). In the case where the D phase processing is performed after the P phase processing, the D phase processing is processing on the signal level Ssig obtained by adding the signal component Vsig to the reset level Srst.

The inventions in commonly-owned patent applications propose various kinds of reference signal comparing type AD conversion methods, such as setting the count operation effective period Ten or performing the differential processing (CDS processing) within the AD conversion section 250, and basically, these methods may also be adopted in each embodiment to be described later.

In all of the processing examples, the reference signal SLP_ADC is supplied to a voltage comparator and an analog pixel signal input through the vertical signal line 19 is compared with the reference signal SLP_ADC. Then, by counting the clock number in the designated count operation effective period Ten by starting the counting in a clock signal when the count operation effective period Ten starts, AD conversion is performed.

In order to perform the reference signal comparing type AD conversion, the AD conversion section 250 includes the comparing section 252 (COMP), a count operation period control section 253 (EN generation), and the counter section 254. Preferably, the counter section 254 is made to be switchable between an up-count mode and a down-count mode. By using an up/down counter, the high frame rate can be realized without increasing the circuit size. In this example, a data storage section 256 having a latch 257 (memory) for horizontal transfer is further provided after the counter section 254 for every column.

The comparing section 252 compares the reference signal SLP_ADC generated in the reference signal generating section 27 with the analog pixel signal voltage Vx obtained from the unit pixel 3 of the selection row through the vertical signal line 19 (H1, H2, ..., Hh). The comparing section 252 inverts the comparison pulse Co (comparator output) when the reference signal SLP_ADC and the pixel signal voltage Vx become equal.

A control signal CN5 which designates the other control information, such as reset processing or setting of the initial value Dini in the P phase count processing or whether the counter section 254 operates the count processing of P and D phases in the up-count mode or down-count mode, is input from the communication and timing control section 20 to the counter section 254 of each AD conversion section 250.

The reference signal SLP_ADC generated by the reference signal generating section 27 is input in common to one input terminal (+) of the comparing section 252 and input terminals (+) of the other comparing sections 252, and the vertical signal line 19 of the corresponding vertical column is connected to the other input terminal (−) of the comparing section 252 so that the pixel signal voltage Vx from the pixel array section 10 is input separately.

The AD clock CKcnt from the communication and timing control section 20 is input in common to a clock terminal CK of the counter section 254 and clock terminals CK of the other counter sections 254. When the data storage section 256 is not provided, a control pulse is input from the horizontal scanning section 12 to the counter section 254 through a control line 12c. The counter section 254 has a latch function of holding a count result and accordingly, holds the counter value until there is an instruction using a control pulse from the control line 12c.

Components of the driving control section 7, such as the horizontal scanning section 12, the vertical scanning section 14, and the like, are formed integrally with the pixel array section 10 in a semiconductor region, such as single crystal silicon, using the same technique as a technique of manufacturing a semiconductor integrated circuit. That is, they are formed on a so-called one chip (provided on the same semiconductor substrate). Thus, the solid state imaging device 1 according to the present embodiment is formed.

The solid state imaging device 1 may be formed as one chip in which respective sections are integrally formed in a semiconductor region as described above. However, although not shown, the solid state imaging device 1 may also be configured in the form of a module which has an imaging function and in which not only various signal processing sections, such as the pixel array section 10, the driving control section 7, and the column AD conversion section 26, but also an optical system, such as an imaging lens, an optical low pass filter, and an infrared cut-off filter, are included.

The output side of each AD conversion section 250, for example, an output of the counter section 254 may be connected to the horizontal signal line 18. Alternatively, as shown in the drawing, a configuration may be adopted in which the data storage section 256 as a memory device having a latch, which holds a count result that the counter section 254 holds, is provided after the counter section 254. The data storage section 256 holds and stores the count data output from the counter section 254 at a predetermined timing.

The horizontal scanning section 12 has a function of a read scanning section, which reads the count value that each data storage section 256 holds in parallel with execution of corresponding processing of each comparing section 252 and each counter section 254 of the column AD conversion section 26. The output of the data storage section 256 is connected to the horizontal signal line 18. The horizontal signal line 18 is a signal line with a bit width of the AD conversion section 250 or a width corresponding to twice the bit width (for example, at the time of complementary output) and is connected to the output section 28 which has the signal amplification section 402 corresponding to each output line. Each of the counter section 254, the data storage section 256, and the horizontal signal line 18 has a configuration corresponding to N bits.

<Reference Signal Generating Section: Basic Configuration>

Figure 2A:
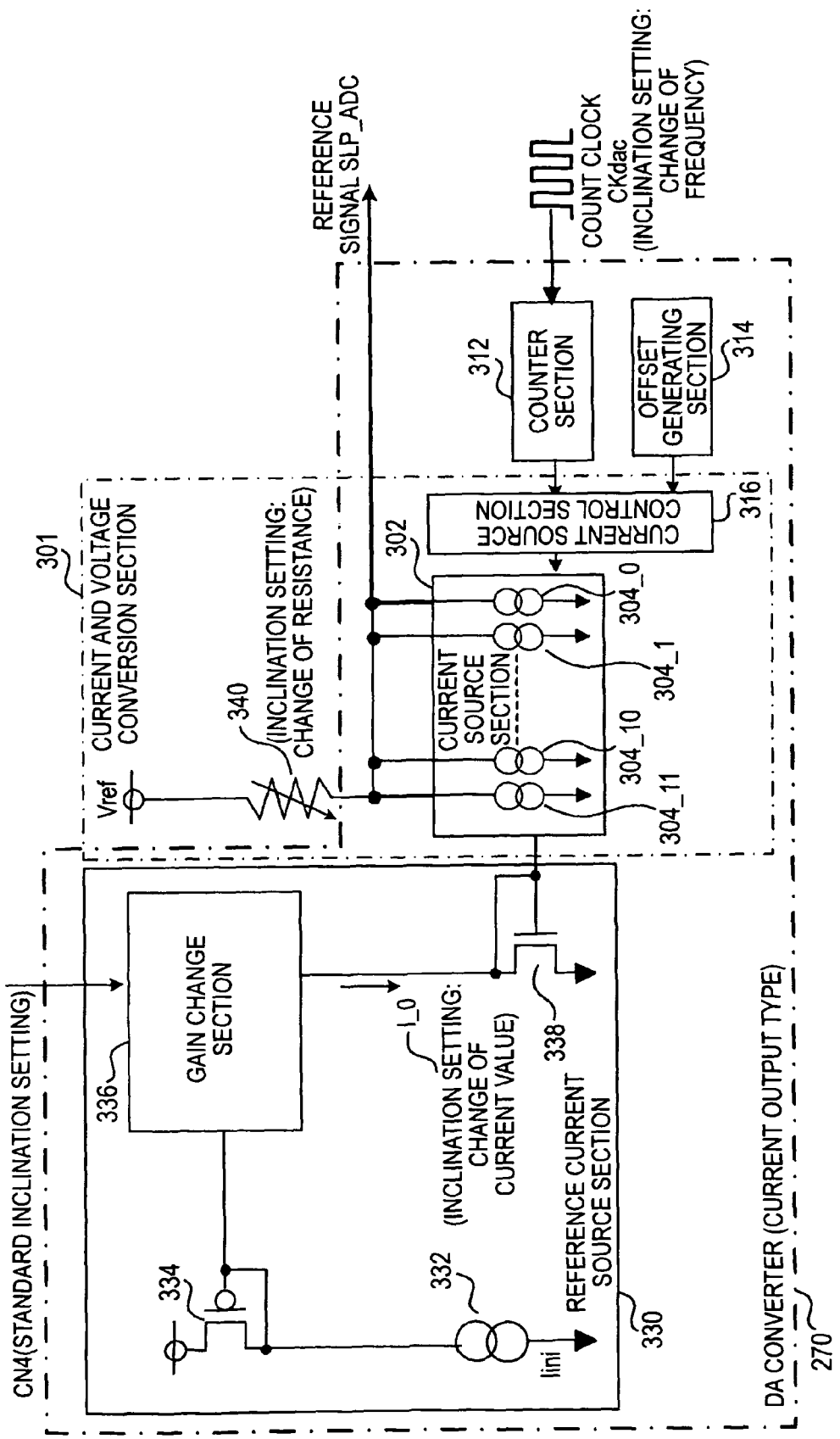
FIG. 2A is a view showing an example of the configuration of a DA conversion section of a reference signal generating section.

FIG. 2A is a view showing an example of the configuration of the DA converter 270 of the reference signal generating section 27. The DA converter 270 includes a current source section 302 formed by combination of constant current sources, a counter section 312, an offset generating section 314, a current source control section 316, and a reference current source section 330 which sets a defined current I_0, and serves as a current output type D/A conversion circuit. To a current output end of the current source section 302, a resistor 340 with a resistance R_340 is connected as a current and voltage conversion section. The current source section 302, the current source control section 316, and the resistor 340 form a current and voltage conversion section 301, and the voltage generated at a connection point between the current source section 302 and the resistor 340 is used as the reference signal SLP_ADC.

The current source section 302 has a constant current source 304 which outputs a predetermined defined current value. The current value of each constant current source 304 of the current source section 302 may be set in various ways, or the constant current sources 304 of the current source section 302 maybe arrayed and controlled in various ways. Here, for easy understanding, it is assumed that the constant current source 304 has as many constant current sources 304 as there are bits and each constant current source 304 outputs a current having a weight of bits with respect to the defined current I_0 set by the reference current source section 330, as an example.

For example, in the case of 12 bits, assuming that "^" indicates power, a constant current source 304_0 of a 0-th bit outputs $2^0 \times I\_0$, a constant current source 304_1 of a first bit outputs $2^1 \times I_{\_0}$. . . , a constant current source 304_10 of a tenth bit outputs $2^{10} \times I\_0$, and a constant current source 304_11 of an eleventh bit outputs $2^{11} \times I\_0$. Current output ends of the constant current sources 304 are connected in common and are also connected to reference power Vref equivalent to an initial potential SLP_ini of the reference signal SLP_ADC through the resistor 340. Although the reference power Vref is set on the basis of the information indicating the initial value of the reference signal SLP_ADC for every comparison processing included in the control data CN4, any kind of circuit configuration for setting the reference power Vref may be used.

The reference current source section 330 includes a constant current source 332 which has one end connected to a negative power supply or ground and generates an initial current Iini, a Pch type transistor 334 which is a load of the constant current source 332, a gain change section 336, and an Nch type transistor 338 which applies a current output from the gain change section 336 to each constant current source 304 of the current source section 302. A source of the transistor 334 is connected to a positive power supply and a drain and a gate thereof are connected in common to an output end of the constant current source 332, and current mirror connection between the transistor 334 and a transistor (not shown) of the gain change section 336 is made.

Although not shown, the gain change section 336 supplies to the transistor 338 the defined current I_0 obtained by multiplying a mirror current from the transistor 334 by a predetermined number. A source of the transistor 338 is connected to a negative power supply or ground and a drain and a gate thereof are connected in common to an output end of the gain change section 336, and current mirror connection between the transistor 338 and each constant current source 304 of the current source section 302 is made.

The gain change section 336 sets a voltage change ΔSLP (=I_0×R_340) per clock on the basis of the information indicating the inclination of the reference signal SLP_ADC for every comparison processing included in the control data CN4 and changes one count value for every DAC clock CKdac. In practice, it is sufficient only to set the maximum voltage width for the maximum number of counts (P phase maximum count number Drm, P phase maximum count number Dsm) of the DAC clock CKdac corresponding to a P phase count period Trm or D phase count period Tsm. By changing the gain for the amount of initial current Iini of the constant current source 332 of the reference current source section 330, ΔSLP per clock is adjusted and as a result, the inclination (rate of change) of the reference signal SLP_ADC is adjusted.

Assuming that the inclination of a reference signal SLP_ADC_P in P phase processing is ΔSLP_P, the amplitude (P phase range Range_P) of the reference signal SLP_ADC_P in the P phase count period Trm is ΔSLP_P·Drm. Assuming that the inclination of a reference signal SLP_ADC_D in D phase processing is ΔSLP_D, the amplitude (D phase range Range_D) of the reference signal SLP_ADC_D in the D phase count period Tsm is ΔSLP_D·Dsm.

The counter section 312 performs the count operation on the basis of the DAC clock CKdac from the communication and timing control section 20 and supplies the count result to the current source control section 316. The offset generating section 314 applies a constant potential (offset amount) to the reference signal SLP_ADC separately from the change based on the count value of the counter section 312 and supplies the information to the current source control section 316. The current source control section 316 determines whether to turn on or off the constant current source 304 on the basis of the count value of the counter section 312 and the information on the offset amount from the current source control section 316, and turns on or off the constant current source 304 on the basis of the determination result.

For easy understanding, it is assumed that the offset amount is zero unless there is a special notice. Accordingly, whenever the count value of the counter section 312 progresses, the DA converter 270 changes a voltage, by ΔSLP for every one DAC clock CKdac, from a voltage indicating the initial value included in the control data CN4. In the case of an up-count operation, a negative inclination occurs since the voltage is decreased by ΔSLP. In the case of a down-count operation, a positive inclination occurs since the voltage is increased by ΔSLP.

In this configuration example, the inclination of the reference signal SLP_ADC can be changed by changing any of the defined current I_0 of the DA converter 270, the resistance R_340 of the resistor 340 for current and voltage conversion, and the DAC clock CKdac used by the counter section 312 which forms the DA converter 270. Even when any of them is changed, the inclination can be made uniform by performing correction on other components in the opposite direction.

In order to change the inclination of the reference signal SLP_ADC, a method may be considered in which the DAC clock CKdac used by the counter section 312 which forms the DA converter 270 is changed without changing the defined current I_0 of the DA converter 270 or the resistance of the resistor 340 for current and voltage conversion. This method is called a method of changing the inclination by change of a clock operation of the counter section 312 of the DA converter 270.

As another method of changing the inclination of the reference signal SLP_ADC for AD conversion, a method may be considered in which the resistance of the resistor 340 for current and voltage conversion is changed without changing the defined current I_0 of the DA converter 270 or the operating speed of the counter section 312 which forms the DA converter 270. This method is called a method of changing the inclination by resistance change in current and voltage conversion.

It is also possible to adopt a method in which the weight corresponding to the count value of the counter section 312 is changed by changing the defined current I_0 of the DA converter 270 without changing the operating speed of the counter section 312, which forms the DA converter 270, or the resistance of the resistor 340 for current and voltage conversion. This method is called a method of changing the inclination by current change in current and voltage conversion. On the other hand, when the DAC clock CKdac is set to 1/M, the inclination of the reference signal SLP_ADC can be made uniform by setting the resistance R_340 of the resistor 340 to 1/M or increasing the defined current I_0 M times.

Moreover, without changing any of the defined current I_0, the resistance R_340, and the DAC clock CKdac, it is possible to cope with the gain change in the unit of "2^n" by changing the operation of the DA converter 270 by shifting a code transmitted to the current source section 302 of the DA converter 270 according to the gain. This method is called a code shifting method.

For example, when the one LSB voltage in 8 bits is set to 1 mV@ 0 dB, a code transmitted to the current source section 302 is assumed as follows.

Normal (1 mV/LSB):(no bit shift)
    00000000 (0 d)→0 mV
    00000001 (1 d)→1 mV
    00000010 (2 d)→2 mV
    00000011 (3 d)→3 mV
Gain doubled (0.5 mV/LSB):(LSB is shifted by one bit)
    00000000 (0 d)→0 mV
    00000010 (2 d)→1 mV
    00000100 (4 d)→2 mV
    00000110 (6 d)→3 mV
Gain quadrupled (0.25 mV/LSB):(LSB is shifted by two bits)
    00000000 (0 d)→0 mV
    00000100 (4 d)→1 mV
    00001000 (8 d)→2 mV
    00001100 (12 d)→3 mV Thus, by bit-shifting a code which operates the current source section 302 of the DA converter 270 by gain multiples, the range extends twice, four times, . . . even if the defined current I_0, the resistance R_340, and the DAC clock CKdac are not changed.

The configurations of the reference signal generating section 27 shown herein are examples, and the method of adjusting the inclination of the reference signal SLP_ADC is not limited to such methods. For example, it is also possible to generate the reference signal SLP_ADC which satisfies a function of $y=\alpha-\beta \cdot x$ including α (initial value) and inclination (rate of change) β in the control data CN4, and the reference signal generating section 27 may be formed without using the counter section 312. However, the configuration of using the counter section 312 is advantageous in that it is easy to generate the reference signal SLP_ADC and correspondence of an operation with the counter section 254 is easily realized.

For example, a configuration may be considered in which the counter output value is set to x and the electric potential calculated by $y=\alpha-\beta \cdot x$ is output while maintaining the period of the DAC clock CKdac applied to the reference signal generating section 27 constant. In this case, adjustment of a voltage change ΔSLP (that is, inclination β of the reference signal SLP_ADC) for every DAC clock CKdac based on the information indicating the inclination β is realized by changing the frequency of the DAC clock CKdac, for example. In addition, as can be seen from the above explanation, ΔSLP per clock may be adjusted by changing the resistance for current and voltage conversion or changing the amount of current of a unit current source.

[Input Stage of a Comparing Section]

FIG. 2B is a view illustrating the configuration and operation of an input stage of the comparing section 252. In connection with the circuit configuration, the comparing section 252 has a feature in a point that a comparison period can be set without being influenced by variation in a reset component ΔV for every unit pixel 3.

As shown in (1) of FIG. 2B, a differential amplifier configuration which is generally known well is used as the basic configuration of the comparing section 252. The comparing section 252 is configured to include a differential transistor pair section 352, a load transistor pair section 360, a current source section 370, and an operating point reset section 380. The differential transistor pair section 352 is formed by NMOS type transistors 353 and 354. The load transistor pair section 360 has PMOS type transistors 362 and 364 serving as an output load of the differential transistor pair section 352 and is disposed at the power supply side. The current source section 370 supplies a fixed operating current to the differential transistor pair section 352 and the load transistor pair section 360 and has an NMOS type constant current source transistor 372 disposed at the ground (GND) side.

A DC gate voltage VG_ADC is input to a gate of the constant current source transistor 372. An output (drain of the transistor 354 in the example shown in the drawing) of the differential transistor pair section 352 is connected to a buffer section (not shown; may be of either non-inverting type or inverting type) having an amplifier function. The output of the differential transistor pair section 352 is output as a comparison pulse Co after being sufficiently amplified in the buffer section.

The operating point reset section 380 is formed by switching transistors 382 and 384. An auto-zero signal AZ is supplied to gates of the switching transistors 382 and 384 in common as a comparator reset signal.

It is assumed that a timing, at which the auto-zero signal AZ becomes active (L level in this example), is within a period for which the pixel signal voltage Vx changes to a reset level Srst after a reset signal RST supplied to a gate end of a reset transistor of the unit pixel 3 changes from active to inactive. Alternatively, the timing is assumed to be within a period for the reset signal RST supplied to the gate end of the reset transistor 36 of the unit pixel 3 is active. During these periods, it is assumed that the reference signal SLP_ADC is at a reset level slightly lower than the initial value which is a start level for change to the ramp shape.

The pixel signal Vx is supplied to a gate (input terminal) of the transistor 353 through a capacitive element 386, and the reference signal SLP_ADC is supplied from the reference signal generating section 27 to a gate (input terminal) of the transistor 354 through a capacitive element 388.

The operating point reset section 380 has a sample/hold function with respect to a signal input through the capacitive elements 386 and 388. That is, only immediately before starting the comparison between the pixel signal Vx and the reference signal SLP_ADC, the auto-zero signal AZ is set to active L, and the operating point of the differential transistor pair section 352 is reset to the drain voltage (operation reference value at which a reference component or a signal component is read). Then, the pixel signal Vx is input to the transistor 353 through the capacitive element 386 and the reference signal SLP_ADC is input to the transistor 353 through the capacitive element 388, and the pixel signal Vx and the reference signal SLP_ADC are compared until they reach the same electric potential. When the electric potentials of the pixel signal Vx and reference signal SLP_ADC become equal, the output is inverted.

At the start of comparison processing, the reference signal SLP_ADC is at a higher level than the pixel signal Vx. For example, an output (comparison pulse Co) of the comparing section 252 is at an L level. Then, when the electric potentials of the pixel signal Vx and reference signal SLP_ADC become equal, the output of the comparing section 252 is inverted from the L level to an H level. This comparison pulse Co is supplied to the count operation period control section 253 (not shown).

The reset signal RST (active state) is supplied to the gate end of the reset transistor of the unit pixel 3 so that the reset transistor is reset. At this time, a noise pulse with a relatively large voltage level is generated in a period for which the reset signal RST is in an active state. Then, when the reset signal RST changes from active to inactive, the pixel signal voltage Vx drops to the reset level Srst. The level of the noise pulse at the time of this reset active and the subsequent reset level Srst vary for every unit pixel 3. The signal level Ssig corresponding to a signal charge detected in a charge generating section is superimposed on the reset level Srst, and the pixel signal voltage Vx appears as the signal level Ssig. Accordingly, if the reset level Srst varies, the signal level Ssig also varies. In this case, there is no influence of variation on the signal level Ssig itself. Taking this point into consideration, the signal level Ssig which is not influenced by the variation is acquired by calculating the difference between the reset level Srst and the signal level Ssig in CDS processing.

Since the reset level Srst varies, the comparison may not be performed correctly if the level exceeds the comparable range of the reference signal SLP_ADC. In order to avoid this situation, at the time of P phase processing, the voltage comparing section 252 is reset to the operation reference value for reading the reset level Srst, and then the reference signal SLP_ADC is supplied to the comparing section 252. Then, comparison processing and count processing are started. That is, the comparing section 252 supplies the auto-zero signal AZ so that gate and drain of the transistors 303 and 304 of the differential transistor pair section 302 are temporarily connected as a diode connection. Then, by inputting the reference signal SLP_ADC after holding one obtained by adding the offset component of the transistor 304 to an input of an amplifying transistor 42 of the unit pixel 3 in the input terminal (gate) of the transistor 304, the comparison between the pixel signal Vx and the reference signal SLP_ADC is started. In this manner, the operating point of the voltage comparing section 252 is set at the read potential of a pixel signal for every unit pixel 3. As a result, the signal level is not easily influenced by variation of the reset level Srst.

In this case, however, kTC noise may be generated if the comparing section 252 is reset to the operation reference. value. Accordingly, at the time of D phase processing, resetting of the comparing section 252 is not performed (auto-zero is not performed) and the reference signal SLP_ADC is immediately supplied to the comparing section 252 to start the comparison processing and the count processing.

[Basic Operation Example of a Solid State Imaging Device]

Figure 3A:
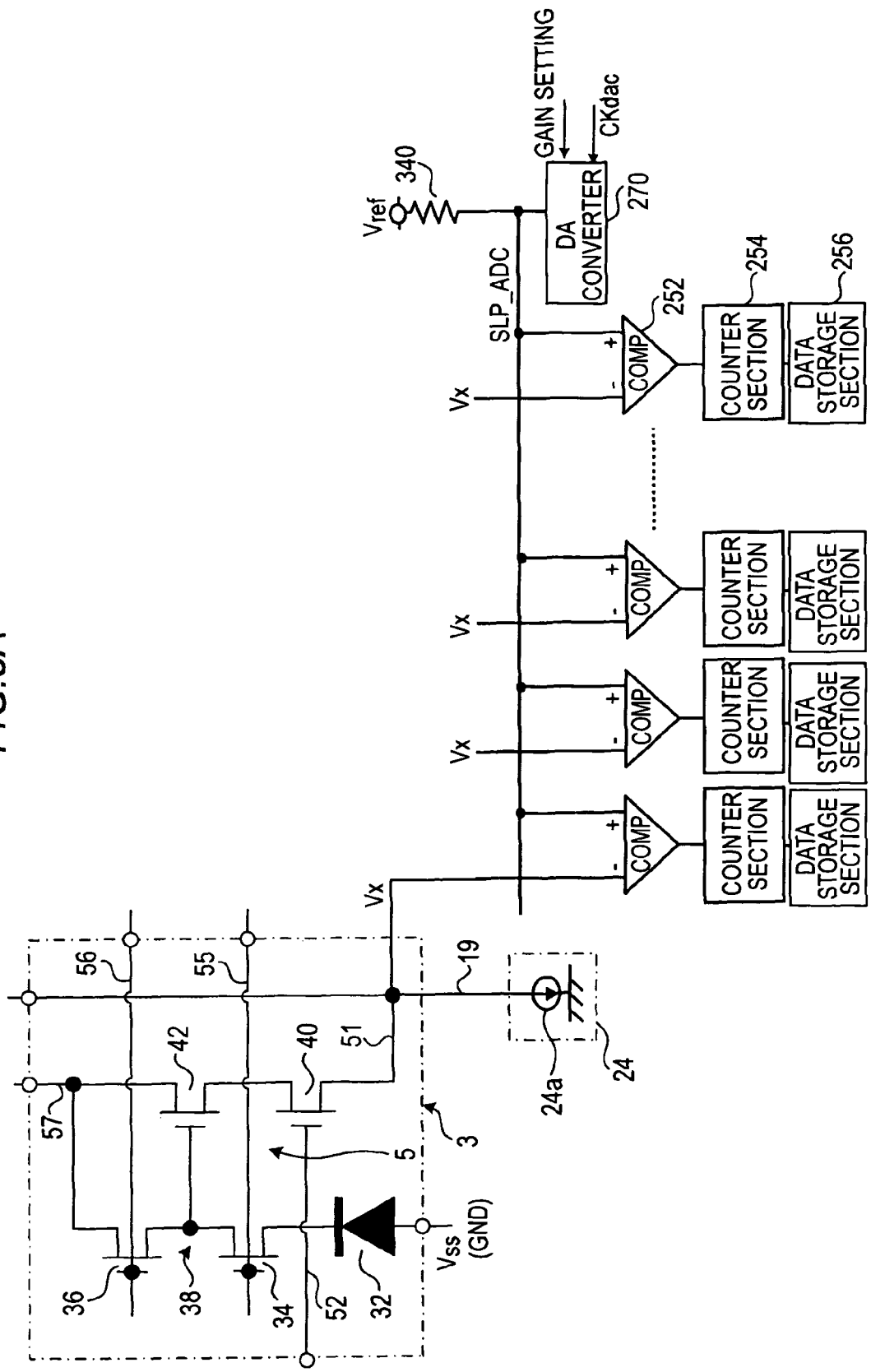
FIG. 3A is a view showing the simple circuit configuration of a solid state imaging device when AD conversion processing and CDS processing are taken into consideration.
Figure 3B:
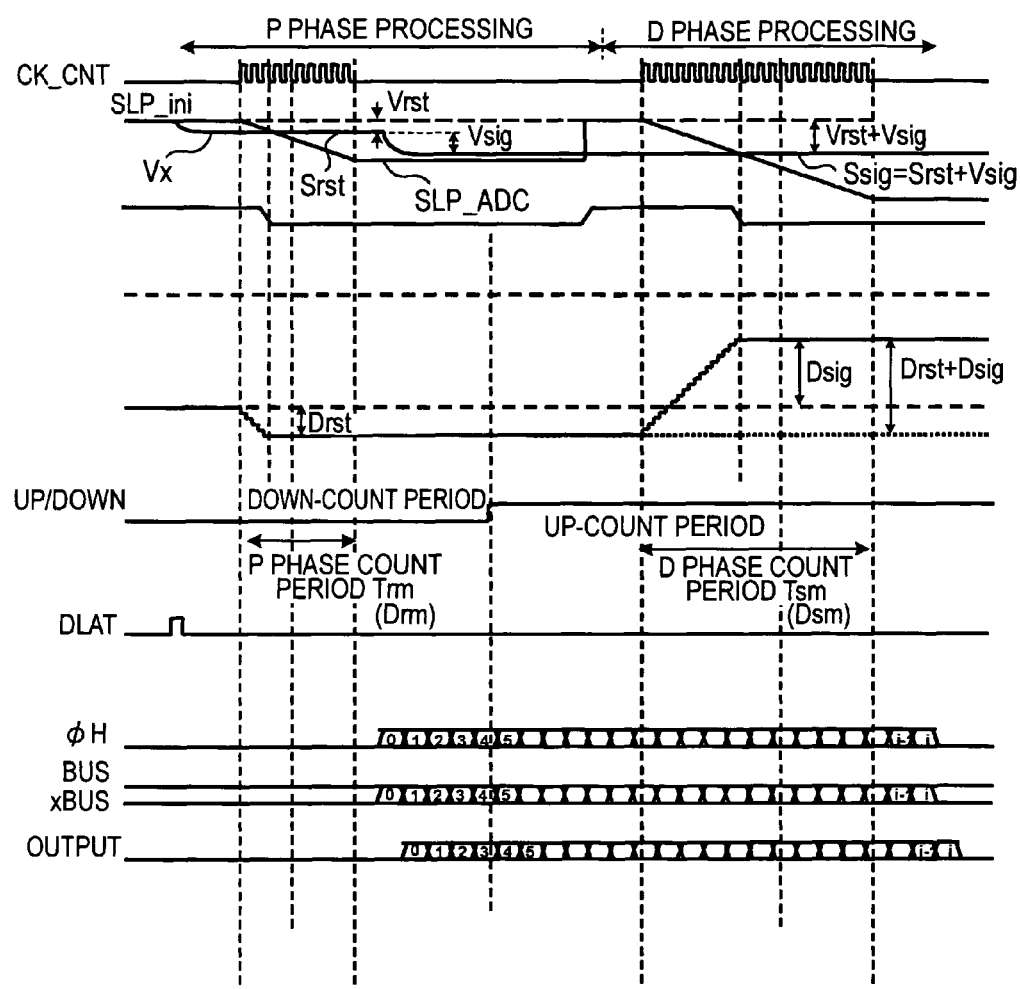
FIG. 3B is a view illustrating a basic operation in reference signal comparing type AD conversion.

FIGS. 3A and 3B are views showing a basic operation of the solid state imaging device 1. FIG. 3A is a view showing the simple circuit configuration of the solid state imaging device 1 when AD conversion processing and CDS processing are taken into consideration. FIG. 3B is a view (timing chart) illustrating the basic operation of reference signal comparing type AD conversion.

As shown in FIG. 3A, the unit pixel 3 has not only a charge generating section 32 but also four transistors (a read selection transistor 34, a reset transistor 36, a vertical selection transistor 40, and an amplifying transistor 42) as basic components which form a pixel signal generating section 5. The read selection transistor 34 which forms a transfer section is driven by a transfer signal TRG. The reset transistor 36 which forms an initialization section is driven by a reset signal RST. The vertical selection transistor 40 is driven by a vertical selection signal VSEL.

The charge generating section 32 is an example of a detector formed by a light receiving element DET, such as a photodiode PD. In the charge generating section 32, an anode of the light receiving element DET is connected to a reference potential Vss on the low potential side, and a cathode side is connected to a source of the read selection transistor 34. The reference potential Vss may be a ground potential GND. A drain of the read selection transistor 34 (transfer gate) is connected to a connection node at which the reset transistor 36, a floating diffusion 38, and the amplifying transistor 42 are connected. A source of the reset transistor 36 is connected to the floating diffusion 38, and a drain of the reset transistor 36 is connected to a reset power supply Vrd (usually set in common with the power supply Vdd).

A drain of the vertical selection transistor 40 is connected to a source of the amplifying transistor 42, a source of the vertical selection transistor 40 is connected to a pixel line 51, and a gate (especially called a vertical selection gate SELV) of the vertical selection transistor 40 is connected to a vertical selection line 52, as an example. A gate of the amplifying transistor 42 is connected to the floating diffusion 38, a drain of the amplifying transistor 42 is connected to the power supply Vdd, and a source of the amplifying transistor 42 is connected to the pixel line 51 through the vertical selection transistor 40 and is also connected to a vertical signal line 19. The drain of the vertical selection transistor 40 may be connected to the power supply Vdd and the source of the vertical selection transistor 40 may be connected to the drain of the amplifying transistor 42, and the source of the amplifying transistor 42 may be connected to the pixel line 51.

One end of the vertical signal line 19 extends to the column AD conversion section 26, and the read current control section 24 is connected in the path. Although not shown in detail, the read current control section 24 has a load MOS transistor in each vertical column. Gates are connected between a reference current source section and a transistor thereby to form a current mirror circuit which functions as a current source 24a for the vertical signal line 19. In addition, a source follower configuration in which an approximately constant operating current (read current) is supplied may be adopted between the read current control section 24 and the amplifying transistor 42.

In the AD conversion section 250, the comparing section 252 of the AD conversion section 250 compares the analog pixel signal voltage Vx read from the unit pixel 3 to the vertical signal line 19 with the reference signal SLP_ADC. Similar to the comparing section 252, the counter section 254 disposed for every column is made to operate by a count enable signal EN, so that the pixel signal voltage Vx of the vertical signal line 19 is converted into digital data by changing each electric potential of the reference signal SLP_ADC while maintaining one-to-one correspondence with the counter section 254.

In this case, the unit pixel 3 is reset first. Then, in the column AD conversion section 26, the comparing section 252 performs an auto-zero operation to generate a reference signal SLP_ADC_P for AD conversion of the reset level Srst after release of auto-zero. Then, the read selection transistor 34 of the unit pixel 3 is turned on to transfer a signal charge of the charge generating section 32 to the floating diffusion 38, and the reference signal SLP_ADC_D for AD conversion of the signal level Ssig is generated in the column AD conversion section 26.

In the count operation effective period, in the case of performing CDS processing in the AD conversion section 250, it is assumed that the count start is a point of time of the change start of the reference signal SLP_ADC and the count end is when the reference signal SLP_ADC and a signal voltage to be processed become equal, for example, in both first processing and second processing. That is, in this processing example, a first-half count operation is applied in both the first processing and the second processing.

As shown in FIG. 3B, in a P phase processing period, the count value of each flip-flop of the counter section 254 is reset to a minimum value min of maximum AD conversion gradation of P phase, for example, reset to "0". AD conversion of the reset level Srst is performed by setting the counter section 254 in a down-count mode and performing in parallel comparison processing between the reference signal SLP_ADC and the reset level Srst of the pixel signal voltage Vx using the voltage comparing section 252 and count processing using the counter section 254.

At the beginning, it is assumed that the reference signal SLP_ADC is higher than the reset level Srst of the pixel signal voltage Vx and the comparison pulse Co of the voltage comparing section 252 is at an H level. After the start of the comparison, the comparison pulse Co of the voltage comparing section 252 changes from H to L when the reset level Srst and the reference signal SLP_ADC become equal, and the counter section 254 holds the count value indicating a digital value Drst corresponding to the size of the reset level Srst. If a sign is taken into consideration, the count value indicates "−Drst".

In a D phase processing period, the signal level Ssig obtained by adding the signal component Vsig to the reset level Srst is read, and the same operation as reading of the P phase is performed. AD conversion of the signal level Ssig is performed by setting the counter section 254 in an up-count mode and performing in parallel comparison processing between the reference signal SLP_ADC and the signal level Ssig of the pixel signal voltage Vx using the voltage comparing section 252 and count processing using the counter section 254.

At the beginning, it is assumed that the reference signal SLP_ADC is higher than the signal level Ssig of the pixel signal voltage Vx and the comparison pulse Co of the voltage comparing section 252 is at an H level. After the start of comparison processing, the comparison pulse Co of the voltage comparing section 252 changes from H to L when the signal level Ssig and the reference signal SLP_ADC become equal. At this time, a count value corresponding to the size of the signal level Ssig is held in the counter section 254.

In this case, from the digital value Drst (here, a negative value) of the reset level Srst, up count is set opposite the case of P phase. Since the signal level Ssig is a level obtained by adding the signal component Vsig to the reset level Srst, the count value of the AD conversion result of the signal level Ssig is basically "Drst+Dsig". However, since a starting point in the up-count operation is "−Drst" which is an AD conversion result of the reset level Srst, the count value which is actually held in the counter section 254 is "−Drst+(Dsig+Drst)=Dsig".

That is, each count mode is set differently in P phase processing and D phase processing by setting the count operation as down count in the P phase processing and as up count in the D phase processing. Accordingly, differential processing (subtraction processing) is automatically performed in the counter section 254. The AD conversion section 250 operates not only as a digital converter, which converts an analog pixel signal into digital pixel data, but also as a section which has a function of CDS processing. The number of counts Dsig held in the counter section 254 indicates digital data corresponding to the signal component Vsig.

In this configuration example, the counter section 254 is configured to perform not only AD conversion processing but also CDS processing. However, this is not indispensable. It is also possible to transfer a P phase processing result and a D phase processing result separately to a subsequent stage and to execute the CDS processing in a processing section provided in the subsequent stage.

[Problem of Reference Signal Comparing Type AD Conversion]

FIGS. 4A and 4B are views illustrating a problem of reference signal comparing type AD conversion. Here, FIG. 4A is a view illustrating the relationship between the bit resolution, the inclination of the reference signal SLP_ADC, and a frequency of the AD clock CKcnt that the counter section 254 uses. FIG. 4B is a view illustrating AD conversion gain change (when the AD conversion gain is 1 time and 2 times) in the case of changing the inclination of the reference signal SLP_ADC without changing the frequency of the AD clock CKcnt.

As shown in (1) of FIG. 4A, the step width ΔSLP of the reference signal SLP_ADC per AD clock CKcnt that the counter section 254 uses in the count operation is the bit resolution, and the inclination of the reference signal SLP_ADC and the frequency of the AD clock CKcnt affect the bit resolution. The AD clock CKcnt when acquiring N bit precision is denoted as an AD clock CKcnt1, and the AD clock CKcnt when the frequency is set to 1/M of a frequency of the AD clock CKcnt1 is denoted as an AD clock CKcnt1/M. The AD clock CKcnt when the frequency is set to M times the frequency of the AD clock CKcnt1 is denoted as an AD clock CKcntM. The same is true for the DAC clock CKdac.

The reference DAC clock CKdac is denoted as a DAC clock CKdac1, and the DAC clock CKdac when the frequency is set to 1/M of a frequency of the DAC clock CKdac1 is denoted as a DAC clock CKdac1/M. The DAC clock CKdac when the frequency is set to M times the frequency of the DAC clock CKdac is denoted as a DAC clock CKdacM.

For example, as shown in (2) of FIG. 4A, if the frequency of the AD clock CKcnt is constant, the step width ΔSLP is large when the inclination of the reference signal SLP_ADC is large. Accordingly, the bit resolution becomes coarse. On the other hand, when the inclination of the reference signal SLP_ADC is small, the step width ΔSLP is small. Accordingly, the bit resolution becomes precise. On the other hand, as shown in (3) of FIG. 4A, if the inclination of the reference signal SLP_ADC is constant, the step width ΔSLP is large when the frequency of the AD clock CKcnt is low. Accordingly, the bit resolution becomes coarse. On the other hand, when the frequency of the AD clock CKcnt is high, the step width ΔSLP is small. Accordingly, the bit resolution becomes precise.

The AD clock CKcnt and the DAC clock CKdac may have different frequencies. In this case, in order to remove an influence of frequency variation on the resolution, it is preferable that the DA converter 270 makes the reference signal SLP_ADC change linearly instead of in the shape of a staircase wave. For example, a method may be adopted in which an electric charge is accumulated in a capacitor and an electric charge is generated by extraction using a constant current source. Moreover, a staircase waveform may be made smooth using a filter.

On the other hand, in the reference signal comparing type AD conversion, the AD conversion range of a signal to be processed is restricted to the reference signal range (amplitude of the reference signal SLP_ADC). Accordingly, since the AD conversion period becomes a period necessary for a change of the reference signal range, there is a problem that the AD conversion period becomes long. In order to solve such a problem, in the method disclosed in JP-A-2005-323331, a total AD conversion period is shortened by making the AD conversion period corresponding to the reset level Srst shorter than that corresponding to the signal level Ssig while maintaining the inclination of the reference signal SLP_ADC constant in both P phase processing and D phase processing.

In this case, however, the AD conversion range at the time of P phase processing becomes narrower than that at the time of D phase processing and accordingly, the reset level Srst deviates from the AD conversion range. As a result, there has been a case where it is difficult to perform "AD conversion+ CDS processing". Referring to FIG. 4B, a description will be given of the circumstances in which this phenomenon occurs.

FIG. 4B shows a case where adjustment of AD conversion gain is performed by inclination change of the reference signal SLP_ADC. As specific examples, cases where the gain is 1 time and 2 times are shown. In the case of performing the AD conversion gain adjustment by inclination change of the reference signal SLP_ADC, the inclination is set to 1/k when the gain is k times the gain set 1 time, as can be estimated from the explanation in FIG. 4A. That is, at the time of adjustment of AD conversion gain, the inclination is reduced by narrowing the amplitude of the reference signal SLP_ADC in a P phase count period Trm or D phase count period Tsm, thereby increasing the resolution in the AD conversion section 250. For example, when the gain increases twice, four times, and eight times, the amplitude of the reference signal SLP_ADC becomes ½, ¼, and ⅛. Accordingly, when the reset level Srst or the signal level Ssig of the same pixel signal voltage Vx is A/D converted, the count value which is an AD conversion result becomes twice, four times, and eight times.

On the other hand, if the AD conversion gain is increased too much, the dynamic range (so-called AD conversion range) of the reference signal SLP_ADC becomes narrow. Especially, the range of the reference signal SLP_ADC_P at the time of P phase processing is narrower than that of the reference signal SLP_ADC_D at the time of D phase processing. Accordingly, as the AD conversion gain increases, the range at the time of P phase processing becomes narrow. For example, when the gain is eight times or more, the range at the time of P phase processing becomes several millivolts to tens of millivolts. In addition, in the case of decreasing the AD conversion gain, the inclination of the reference signal SLP_ADC increases. Accordingly, there is no problem since the P phase range Range_P increases.

For example, if 7 bits in P phase, 10 bits in D phase, 1 LSB=1 mV are assumed, 128 mV in P phase and 1024 mV in D phase are obtained when the gain is 1 time and 16 mV in P phase and 128 mV in D phase are obtained when the gain is 8 times. Furthermore, assuming that the saturation signal amount of a pixel is 20000 e$^-$ and the conversion efficiency is 50 uV/e$^-$, the vertical signal line level becomes 1000 mV. In order to perform AD conversion of this, 1000 mV is necessary in the D phase. Here, in the case of 7 bits in P phase and 10 bits in D phase, P phase=about 16 mV when the gain is 8 times and P phase=about 8 mV when the gain is 16 times.

Accordingly, in the case of a high gain, an influence of random noise on a pixel becomes relatively large. Even if the comparing section 252 is made to have an auto-zero function, the reset level Srst may be out of the range of the reference signal SLP_ADC.

Moreover, as shown in (2) of FIG. 2B, in the auto-zero function of the comparing section 252, the reset level Srst of the pixel signal voltage Vx after release varies due to feedthrough at the time of release of the auto-zero function or variation in charge injection. It causes no trouble if the range of the reference signal SLP_ADC is large. However, since the range of the reference signal SLP_ADC is narrow at the time of a high gain, deviation from the range may also be considered. As a method for solving such a problem, it may be considered to set the initial value of the reference signal SLP_ADC according to the variation direction. However, as shown in (2) of FIG. 2B, the variation direction is not actually constant. Accordingly, it is difficult to adopt the method.

As a result, when these phenomena occur, a problem occurs in which the reset level Srst at the time of P phase processing is not settled in the range (P phase range Range_P) of the reference signal SLP_ADC and it is difficult to perform CDS processing accordingly.

In the present embodiment, using the characteristic of the reference signal comparing type AD conversion, a structure for solving a problem related to narrowing of the reference signal range in the P phase processing period is adopted by setting a P phase processing period shorter than a D phase processing period so that the entire AD conversion period becomes short. The basic idea is that at least when increasing the gain, the range of the reference signal SLP_ADC_P at the time of P phase processing is set to be larger than that in the related art.

First Embodiment

Figure 5:
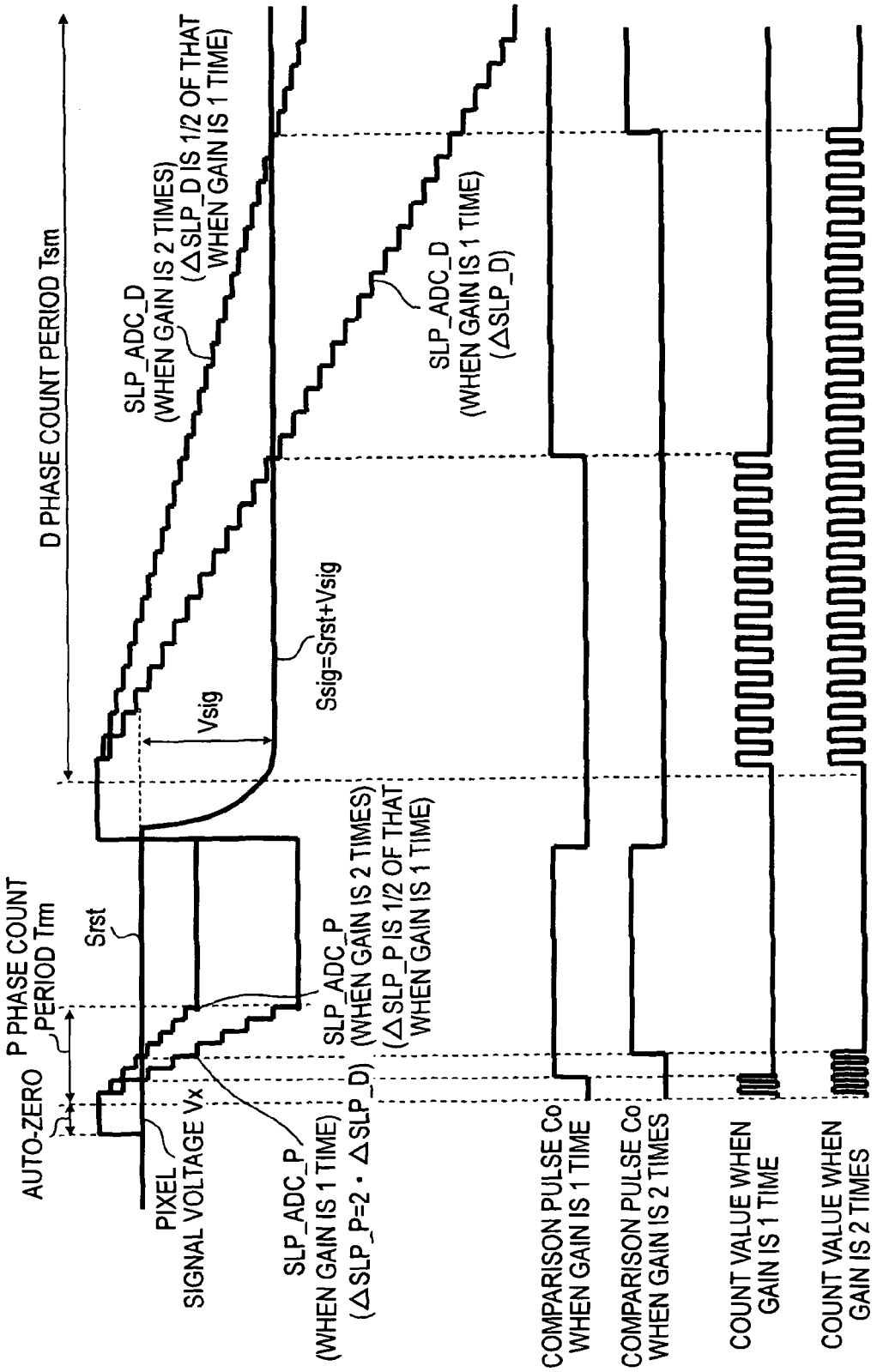
FIG. 5 is a timing chart illustrating an operation in a first embodiment.

FIG. 5 is a view (timing chart illustrating the operation) illustrating a first embodiment. Here, cases where the gain is 1 time and 2 times are shown.

In the first embodiment, the inclination of the reference signal SLP_ADC is set separately in P and D phases all the time regardless of the gain setting value. Particularly, the inclination of the reference signal SLP_ADC at the time of P phase processing is set to be larger than that at the time of D phase processing. In the gain adjustment, the inclination ΔSLP_D of the reference signal SLP_ADC_D at the time of D phase processing is changed according to gain setting and the inclination ΔSLP_P of the reference signal SLP_ADC_P at the time of P phase processing is also changed according to gain setting. For any gain, the inclination ΔSLP_P is set to be larger than the inclination ΔSLP_D all the time.

The number of counts is set to x (>1), and ΔSLP_P=x·ΔSLP_D is satisfied all the time regardless of gain setting. When the first embodiment is not applied, ΔSLP_P=ΔSLP_D and P phase range Range_P0=ΔSLP_P·Drm are satisfied for any gain. On the other hand, if the first embodiment is applied, P phase range Range_P1=x·ΔSLP_P·Drm>P phase range Range_P0 is satisfied for any gain. Also in the same P phase count period Trm as in the case where the present embodiment is not applied, the P phase range Range_P in each gain is sure to be larger than the case where the present embodiment is not applied. Since the relationship is satisfied all the time even in the case where the gain is increased by changing the inclination of the reference signal SLP_ADC, it is possible to reduce the possibility that a problem related to range deviation of the reset level Srst when increasing the gain will occur.

Preferably, the AD clock CKcnt is increased x times at the time of P phase processing so that a drop of AD conversion gain to 1/x time caused by having increased the P phase range Range_P x times can be compensated. This is because CDS processing can be performed in the counter section 254. If AD conversion is performed without increasing the AD clock CKcnt x times at the time of P phase processing, it is difficult to perform the CDS processing simultaneously in the counter section 254. Accordingly, it is necessary to transfer a P phase processing result and a D phase processing result to a processing section provided in a subsequent stage and to perform the CDS processing and gain correction of k times in the subsequent processing section.

In this case, in the P phase processing, an AD clock CKcntx and a DAC clock CKdacx with frequencies which are x times the frequencies of the AD clock CKcnt1 and DAC clock CKdac1 at the time of D phase processing are supplied to the counter section 254 and the DA converter 270, respectively. For this reason, in the P phase processing, the operation is performed in a frequency which is x times a frequency at the time of D phase processing, regardless of the AD conversion gain. Accordingly, there is a concern about an influence of high-frequency noise of a clock depending on the layout method. However, since the P phase range Range_P is made larger than in the related art, an influence of the noise on the reference signal SLP_ADC_P can be reduced regardless of a layout method.

That is, although the frequency of the AD clock CKcnt at the time of P phase processing becomes high, the amplitude (P phase range Range_P1) of the reference signal SLP_ADC_P can also be enlarged in the same P phase count period Trm more than that in the case where the first embodiment is not applied. Also in the same P phase count period Trm, it is possible to reduce a possibility that a problem related to deviation of the reset level Srst from the P phase range Range_P will occur.

The driving frequencies of the counter section 254 and DA converter 270 are increased only at the time of P phase processing. Accordingly, compared with a case where the frequencies are increased and used in both P and D phases, instantaneous current consumption of the counter section 254 at the time of D phase processing is small. As a result, the noise influence is smaller than the case where the first embodiment is not applied. Since a logic function for association with a gain is not necessary unlike a second embodiment to be described below, there is also an advantage that an internal control circuit is not necessary.

Second Embodiment

FIGS. 6A and 6B are views illustrating a second embodiment. FIG. 6A is a timing chart illustrating an operation in the second embodiment. FIG. 6B is a view illustrating a clock supplying method for realizing the second embodiment. In FIGS. 6A and 6B, cases where the gain is 1 time and 2 times are shown.

In the second embodiment, the same setting as in the related art is applied at the time of normal gain (gain setting value=1). Only when the gain setting value k is set to a value exceeding 1 (when increasing the gain), the inclination of the reference signal SLP_ADC is set separately in P and D phases such that ΔSLP_P=k·ΔSLP_D is satisfied. This is based on the idea that the method in the first embodiment is applied only when increasing the gain.

Preferably, at the time of P phase processing, the inclination ΔSLP_P of the reference signal SLP_ADC is fixed to ΔSLP_0 and the P phase range Range_P2=ΔSLP_0·Drm is maintained, regardless of the gain setting value. If the second embodiment is not applied, the inclination ΔSLP_P of the reference signal SLP_ADC is set to ΔSLP_0/k according to the gain setting value k. However, since it is not performed, the P phase range Range_P2 when increasing the gain is increased k times. As a result, it is possible to reduce a possibility that a problem related to range deviation of the reset level Srst will occur. On the other hand, in the D phase, the inclination ΔSLP_D of the reference signal SLP_ADC is set to ΔSLP_0/k according to the gain setting value k.

Preferably, the AD clock CKcnt is increased k times so that a drop of AD conversion gain to 1/k time caused by having increased the P phase range Range_P2 k times at the time of gain increase can be compensated. This is because CDS processing can be performed in the counter section 254. If AD conversion is performed without increasing the AD clock CKcnt k times, it is difficult to perform the CDS processing simultaneously in the counter section 254. Accordingly, it is necessary to transfer a P phase processing result and a D phase processing result to a digital operation section provided in a subsequent stage and to perform the CDS processing and gain correction of k times in the subsequent digital operation section.

For example, in order to double the gain without changing the frequency of the AD clock CKcnt at the time of D phase processing, the inclination of the reference signal SLP_ADC_D is set to ½ by changing the reference current value or voltage conversion resistance of the DA converter 270 such that a voltage change ΔSLP per one clock is set to ½.

In P phase processing, in order to maintain the same P phase range Range_P as when the gain is 1 time in the same P phase count period Trm as when the gain is 1 time with the reference current value or the voltage conversion resistance at the time of D phase processing, the frequency of the DAC clock CKdac for the DA converter 270 is doubled. That is, change from the DAC clock CKdac1 to the DAC clock CKdac2 is performed. Although the voltage change ΔSLP per one clock of the DAC clock CKdac is the same in the P and D phases, the inclination per unit time becomes twice that at the time of D phase processing because the frequency of the DAC clock CKdac doubles. Accordingly, the P phase range Range_P can be increased twice compared with that in the known example when the gain is 2 times.

In this case, since the AD conversion gain at the time of P phase processing becomes ½ (gain doubled) of that at the time of D phase processing (gain doubled), the frequency of the AD clock CKcnt for the counter section 254 is doubled. That is, change from the AD clock CKcnt1 to the AD clock CKcnt2 is performed. For this reason, also in the P phase processing, the AD conversion gain doubles similarly to the D phase processing.

As a result, in each of the P phase processing and the D phase processing, the AD clock CKcnt and the DAC clock CKdac have the same frequency both when the gain is 1 time and when the gain is 2 times.

Although this example is an example of doubling the AD conversion gain, it is also preferable to perform processing according to the gain setting when the AD conversion gain is increased 4 times and 8 times. As a result, the inclination ΔSLP_D of the reference signal SLP_ADC_D at the time of D phase processing is changed according to gain setting, but the inclination ΔSLP_P of the reference signal SLP_ADC_P at the time of P phase processing is maintained constant regardless of gain setting.

Moreover, although the P phase range Range P2 when the gain doubles is doubled to that in the known example, this is only an example and it is preferable to extend the range more than in the related art. For example, when the gain doubles, the P phase range Range_P may be increased 3 or 4 times that in the related art. That is, the point is that when increasing the gain, the inclination ΔSLP_P of the reference signal SLP_ADC_P per unit time at time of P phase processing is preferably set to be larger than the inclination ΔSLP_D of the reference signal SLP_ADC_D per unit time at the time of D phase processing.

Accordingly, regardless of the gain setting value, only the P phase range Range_P can be increased k times that in the known example without changing a period until AD conversion is performed from reading of the pixel signal voltage Vx. As a result, the AD conversion gain can be set to an even higher gain.

In P phase processing when the gain is k times, the AD clock CKcntk and the DAC clock CKdack are supplied to the counter section 254 and the DA converter 270. In the P phase processing when the gain is k times, there is a concern about the influence of a high-frequency noise of the clock depending on the layout method because the operation is performed under the conditions where the gain is k times. In the second embodiment, however, since the driving frequency of the counter section 254 and the DA converter 270 in P phase processing is changed in association with the AD conversion gain, the influence of noise can be suppressed to the minimum regardless of a layout method.

Since the driving frequency of the counter section 254 and the DA converter 270 is increased only in the P phase processing time when increasing the gain, the influence of noise is reduced more than in the first embodiment. Although the frequency of the AD clock CKcnt at the time of P phase processing becomes high when increasing the gain, there is an advantage that the P phase range Range_P can extend without changing the P phase count period Trm similar to the first embodiment.

A method of supplying the AD clock CKcnt and the DAC clock CKdac in the second embodiment is shown in FIG. 6B. In FIG. 6A, in each of the P phase processing and the D phase processing, the AD clock CKcnt and the DAC clock CKdac have the same frequency both when the gain is 1 time and when the gain is 2 times. Noting this point, in this configuration example, the clock conversion section 20a has a phase synchronization section 502 (PLL), a dividing section 504, and a selector 506 for supplying a clock as a source of the AD clock CKcnt and the DAC clock CKdac. The AD conversion gain setting information is notified from the system control section 20b to the phase synchronization section 502 and the dividing section 504. The AD conversion gain setting information and a P-D phase change pulse for distinguishing P phase processing from D phase processing are supplied from the system control section 20b to the selector 506.

The phase synchronization section 502 generates a clock CLK with a frequency corresponding to the AD conversion gain setting information and supplies the clock CLK to one input end of the dividing section 504 and one input end of the selector 506. For example, the phase synchronization section 502 generates a clock CLK1 with a normal frequency when the AD conversion gain is 1 time and generates a clock CLKk (clock CLK2 when the AD conversion gain is 2 times) with a frequency, which is k times the frequency in the normal case, when the AD conversion gain is k times. The dividing section 504 divides the clock CLK to 1/k according to the AD conversion gain setting information and supplies it to the other input end of the selector 506. The selector 506 selects one of the clocks of two input ends according to the AD conversion gain setting information and the P-D phase change pulse and outputs the selected clock as the AD clock CKcnt or DAC clock CKdac.

For example, when the AD conversion gain is 1 time, in both the P and D phases, the phase synchronization section 502 generates a clock CLK1 with a normal frequency and the selector 506 selects the clock CLK1, and the clock CLK1 is used as the AD clock CKcnt1 or the DAC clock CKdac1. Moreover, in this case, the selector 506 may select the clock CLK of either input end.

On the other hand, when the AD conversion gain is k times, the phase synchronization section 502 generates the clock CLKk with a frequency which is k times the frequency in the normal case. At the time of P phase processing, the clock CLKk is selected by the selector 506 and is used as the AD clock CKcntk or the DAC clock CKdack. At the time of D phase processing, the clock CLK1 divided by the dividing section 504 is selected by the selector 506 and is used as the AD clock CKcnt1 or the DAC clock CKdac1.

In this configuration example, the counter section 254 and the DA converter 270 operate in a driving frequency of k times only at the time of P phase processing when the gain is k (>1) times. Since this is a configuration where the dividing section 504 and the selector 506 are added compared with known methods, it can be realized with little influence on the circuit size.

Third Embodiment

FIG. 7 is a view (timing chart illustrating the operation) illustrating a third embodiment. Here, cases where the gain is 1 time and 2 times are shown.

In the third embodiment, the inclination of the reference signal SLP_ADC is set to be equal both in P and D phases regardless of gain setting (ΔSLP_P=ΔSLP_D). In addition, the P phase processing period (P phase count period Trm) is changed in association with the set value of the AD conversion gain.

For example, when increasing the gain k times, the inclination of the reference signal SLP_ADC in P and D phases is set equal (ΔSLP_P/k=ΔSLP_D/k) and the P phase count period Trm is increased k times. If the third embodiment is not applied, the P phase count period Trm is constant regardless of the gain setting value k. As a result, since the P phase range Range_P0 becomes 1/k time, the P phase range Range_P0 becomes narrow according to the gain setting value k.

On the other hand, if the third embodiment is applied, the inclination becomes ΔSLP_P/k but the P phase count period Trm increases k times. Accordingly, the P phase range Range_P3 is maintained constant. Since the P phase range Range_P3 when increasing the gain is increased k times, it is possible to reduce a possibility that a problem related to range deviation of the reset level Srst when increasing the gain will occur.

This is a method in which, when an AD conversion time is sufficient, the P phase range Range_P is increased by extending the P phase count period Trm in association with setting the AD conversion gain without changing the driving frequency of the counter section 254 (preferably, including the DA converter 270) at the time of P phase processing. This is similar to the second embodiment in a point that the P phase range Range_P is changed in association with setting the AD conversion gain, but the structures for realizing those described above are different.

In the third embodiment, when increasing the gain, the P phase count period Trm becomes longer than that in the first and second embodiments (also in the related art). However, unlike the first and second embodiments, there is an advantage that the P phase range Range_P can be extended without changing the frequency of the AD clock CKcnt.

[Comparison Between the First to Third Embodiments and Other Modifications]

As another method, it may be considered to increase the frequency of the AD clock CKcnt while maintaining the same reference signal range as when the normal gain is set without changing the inclination of the reference signal SLP_ADC when increasing the gain, in both the P and D phases. In this method, however, each counter section 254 of the column AD conversion section 26 operates at a higher speed than in the normal case in both the P and D phases. As a result, a problem, such as an increase in power consumption or noise, occurs. In the methods using the structures described in the first to third embodiments, the driving frequency of the counter section 254 is increased only at the time of P phase processing. Accordingly, compared with a case where the frequency is increased and used in both the P and D phases, instantaneous current consumption of the counter in the D phase is small and there is little influence of noise either.

Fourth Embodiment

<Imaging Apparatus>

Figure 8:
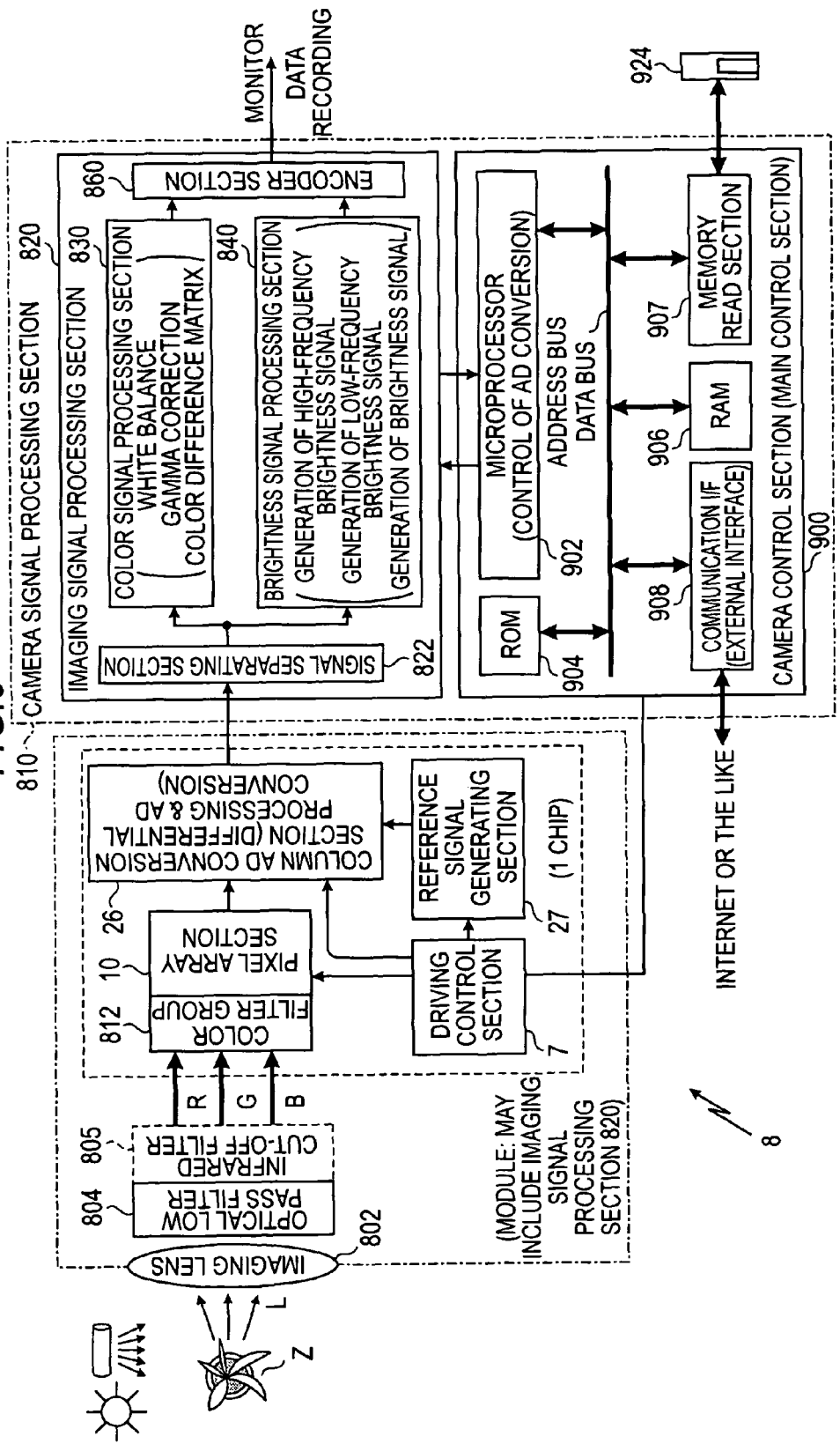
FIG. 8 is a view illustrating a fourth embodiment (imaging apparatus).

FIG. 8 is a view illustrating a fourth embodiment. In the fourth embodiment, the structure for AD conversion processing adopted in the solid state imaging device 1 according to each of the embodiments described above is applied to an imaging apparatus which is an example of a physical information acquisition apparatus. FIG. 8 is a view showing the schematic configuration of the imaging apparatus 8. The main components of the imaging apparatus 8 are as follows (other components will not be described).

The imaging apparatus 8 includes an imaging lens 802, an optical low pass filter 804, a color filter group 812, a pixel array section 10, a driving control section 7, a column AD conversion section 26, a reference signal generating section 27, and a camera signal processing section 810. As shown by a dotted line in FIG. 8, an infrared cut-off filter 805 for reducing an infrared component may also be provided so as to be combined with the optical low pass filter 804. The camera signal processing section 810 provided behind the column AD conversion section 26 includes an imaging signal processing section 820 and a camera control section 900 functioning as a main control section that controls the entire imaging apparatus 8. The imaging signal processing section 820 includes a signal separating section 822, a color signal processing section 830, a brightness signal processing section 840, and an encoder section 860.

The camera control section 900 in the present embodiment includes: a microprocessor 902, a ROM (Read Only Memory) 904 which is a storage section for read only, a RAM (Random Access Memory) 906, and other peripheral members not shown in the drawing. The microprocessor 902 is a core section of a computer, a representative example of which is a CPU (Central Processing Unit) in which functions of operations and controls performed by the computer are integrated in a micro integrated circuit. The RAM 906 is an example of a volatile storage section in which writing and reading are possible when necessary. The microprocessor 902, the ROM 904, and the RAM 906 are collectively called a microcomputer.

The camera control section 900 controls the entire system. In connection with the double AD conversion processing in the present embodiment, the camera control section 900 has a function of adjusting the frequencies of the count clocks CKcnt1 and CKdac1, the inclination of the reference signal SLP_ADC, and the like. For example, a control program of the camera control section 900 is stored in the ROM 904. Particularly in this example, a program for controlling the reference signal comparing type AD conversion processing in which gain change is performed by inclination change of a reference signal by the camera control section 900 is stored. Data and the like necessary when the camera control section 900 performs various kinds of processing are stored in the RAM 906.

The camera control section 900 is configured such that a recording medium 924, such as a memory card, can be inserted thereinto or detached therefrom and is also configured to be able to be connected with a communication network, such as the Internet. For example, the camera control section 900 includes a memory read section 907 and a communication I/F (interface) 908 in addition to the microprocessor 902, the ROM 904, and the RAM 906.

For example, the recording medium 924 is used to register program data, which is used to cause the microprocessor 902 to execute software processing, or exposure control processing (including an electronic shutter control) or a convergence range of photometric data DL based on a brightness signal from the brightness signal processing section 840. Particularly in the present embodiment, the recording medium 924 is also used to register various kinds of data, such as the set value of various kinds of control information for changing a gain by inclination change of a reference signal. The memory read section 907 stores (installs) the data read from the recording medium 924 in the RAM 906. The communication I/F 908 performs transmission and reception of the communication data between a communication network, such as the Internet, and the camera control section 900.

The imaging apparatus 8 is shown in a module form in which the drive control section 7 and the column AD conversion section 26 are formed separately from the pixel array section 10. However, the imaging apparatus 8 may use the solid state imaging device 1 in the form of one chip in which the drive control section 7 and the column AD conversion section 26 are integrally formed on the same semiconductor substrate as the pixel array section 10. In the drawing, the imaging apparatus 8 is shown under the conditions in which an optical system, such as the imaging lens 802, the optical low pass filter 804, and the infrared cut-off filter 805, is also included in addition to the pixel array section 10, the driving control section 7, the column AD conversion section 26, the reference signal generating section 27, and the camera signal processing section 810. This is suitable for a case of adopting the form of a module which has an imaging function and in which the above-described components are collectively packaged. Such an imaging apparatus 8 is provided, for example, as a camera or a portable apparatus having an imaging function, which is used to perform 'imaging'. In addition, 'imaging' includes not only taking a picture in the usual sense of a camera photograph but also has a broader application such as fingerprint detection.

Also in the imaging device 8 configured as described above, the problem that the reset level Srst deviates from the P phase range Range_P can be solved by applying the structure of the above embodiment in which the P phase range Range_P extends. In this case, regarding the control in connection with AD conversion gain setting, frequency setting of the AD clock CKcnt, or inclination setting of the reference signal SLP_ADC, an external main control section (camera control section 900) designates the instruction information for control by data setting for the communication and timing control section 20.

The technical range of the present invention is not limited to the range described in the above embodiment, but various changes and modifications may be made in the embodiments without departing from the spirit and scope of the present invention and those obtained by adding such changes and modifications are also included in the technical range of the present invention. The above-described embodiments do not limit the invention as defined in the appended claims, and every combination of the features described in the embodiments are not necessary for the solving means of the invention. Inventions in various phases are included in each embodiment, and various inventions are extracted by a proper combination of a plurality of the components disclosed. Even if some components are removed from amongst all the components shown in the embodiments, the configuration where some of the components are removed may also be extrapolated as an invention as long as the effect of the present invention can be achieved.

In the first and second embodiments, when maintaining the P phase count period Trm in the same manner as in the related art and setting $\Delta SLP\_P > \Delta SLP\_D$ at least in increasing the gain, $\Delta SLP$ is set equal in the P and D phases and the frequency of the DAC clock CKdac in the P phase is set high in association with the gain. However, this is only an example. Since $\Delta SLP = I\_0 \times R\_340$ is satisfied, the frequency of the DAC clock CKdac may be set equal in the P and D phases and $\Delta SLP$ in the P phase may be set high in association with the gain by change of the defined current $I\_0$ or resistance $R\_340$.

Moreover, it is possible to adopt a combination of the structures of the first and second embodiments, in which $\Delta SLP\_P > \Delta SLP\_D$ is set while maintaining the P phase count period Trm in the same manner as in the related art, and the structure of the third embodiment, in which the P phase count period Trm is changed in association with a gain while maintaining $\Delta SLP\_P = \Delta SLP\_D$. In addition, consideration may be given to applying the second embodiment so that $\Delta SLP\_P = \Delta SLP\_D$ is set if the gain is equal to or smaller than 1 and to applying the first embodiment so that $\Delta SLP\_P > \Delta SLP\_D$ is set if the gain is larger than 1. Regarding the configuration of the apparatus, it is also possible to adopt a configuration where the reference signal generating section 27 is provided externally to the solid state imaging device 1.

In the first to fourth embodiments, examples for solving the problem of the P phase range Range_P in the solid state imaging device 1 or imaging apparatus 8 which adopts the reference signal comparing type AD conversion processing have been explained. However, the range of application is not limited to the solid state imaging device and the like. Applications to general electronic apparatuses which adopt the reference signal comparing type AD conversion processing may also be made. The application may be configured to acquire digital data corresponding to a difference between a voltage level, which is a relatively low level, and a voltage level, which is a relatively high level.

Here, the "voltage level which is a relatively low level" is a reference side, and the "voltage level which is a relatively high level" is a side including a component of the difference to be acquired. If a problem that the voltage level on the reference side deviates from the conversion range of the reference signal SLP_ADC due to an influence of noise or auto-zero function in the comparing section 252 occurs when converting a difference between two analog signal levels into digital data by applying the reference signal comparing type AD conversion processing, the structures of the above-described embodiments can be applied as measures against the problem.

The present application contains subject matter related to that disclosed in Japanese Priority Patent Applications JP 2009-090764 and 2010-044532 filed in the Japan Patent Office on Apr. 3, 2009 and Mar. 1, 2010, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   an AD conversion section that has a comparing section, which receives a reference signal whose level changes gradually from a reference signal generating section that generates the reference signal and which compares the reference signal with an analog signal to be processed, and
   a counter section, which receives a count clock for AD conversion and performs a count operation on the basis of a comparison result of the comparing section, and that acquires digital data of the signal to be processed on the basis of output data of the counter section;
   a count operation period control section that controls an operation period of the counter section in each processing period on the basis of the comparison result of the comparing section; and
   a driving control section that controls the reference signal generating section and the AD conversion section,
   wherein the driving control section controls the reference signal generating section such that the inclination of the reference signal per unit time in a processing period of a reference side supplied for differential processing is larger than that in a processing period of a side including a difference acquired in the differential processing.

2. The electronic apparatus according to claim 1,
   wherein the driving control section controls the AD conversion section such that a frequency of a count clock for AD conversion in the processing period of the side including the difference is constant regardless of a set value of an AD conversion gain, and controls the reference signal generating section such that the inclination of the reference signal of the reference side and the inclination of the reference signal of the side including the difference are changed according to the set value of the AD conversion gain and the inclination of the reference signal of the reference side is larger than that of the side including the difference regardless of the set value of the AD conversion gain.

3. The electronic apparatus according to claim 2, wherein the driving control section controls the AD conversion section such that a count clock for AD conversion in a processing period of the reference side has a frequency corresponding to the set value of the AD conversion gain.

4. The electronic apparatus according to claim 1, wherein the driving control section controls the AD conversion section such that a frequency of a count clock for AD conversion in the processing period of the side including the difference is constant regardless of a set value of an AD conversion gain, controls the reference signal generating section to change the AD conversion gain by change of the inclination of the reference signal, controls the reference signal generating section such that the inclination of the reference signal of the reference side is equal to the inclination of the reference signal of the side including the difference when the AD conversion gain is 1 time, and controls the reference signal generating section such that the inclination of the reference signal of the reference side is larger than the inclination of the reference signal of the side including the difference when the AD conversion gain is larger than 1 time.

5. The electronic apparatus according to claim 1, wherein the driving control section controls the AD conversion section such that a frequency of a count clock for AD conversion in the processing period of the side including the difference is constant regardless of a set value of an AD conversion gain, and controls the reference signal generating section such that the inclination of the reference signal of the side including the difference is changed according to the set value of the AD conversion gain and the inclination of the reference signal of the reference side is maintained as a fixed value regardless of the set value of the AD conversion gain.

6. The electronic apparatus according to claim 1, further comprising:
a pixel array section in which unit pixels, each of which has a charge generating section and a transistor that outputs a signal to be processed including a reset level and a signal level corresponding to an electric charge generated in the charge generating section, are arrayed in a matrix.

7. The electronic apparatus according to claim 6, further comprising:
a main control section that controls the driving control section.

8. An electronic apparatus comprising:
an AD conversion section that has a comparing section, which receives a reference signal whose level changes gradually from a reference signal generating section that generates the reference signal and which compares the reference signal with an analog signal to be processed, and a counter section, which receives a count clock for AD conversion and performs a count operation on the basis of a comparison result of the comparing section, and that acquires digital data of the signal to be processed on the basis of output data of the counter section;
a count operation period control section that controls an operation period of the counter section in each processing period on the basis of the comparison result of the comparing section; and
a driving control section that controls the reference signal generating section and the AD conversion section,
wherein the driving control section controls the AD conversion section such that a processing period of a reference side supplied for differential processing is changed according to a set value of an AD conversion gain and a frequency of a count clock for AD conversion in a processing period of the reference side and a processing period of the side including the difference acquired in the differential processing is constant regardless of the set value of the AD conversion gain, and controls the reference signal generating section such that the inclination of the reference signal per unit time in the processing period of the reference side is equal to the inclination of the reference signal per unit time in the processing period of the side including the difference regardless of the set value of the AD conversion gain.

9. An AD converter comprising:
a reference signal generating section that generates a reference signal whose level changes gradually;
a comparing section that compares an analog signal to be processed with the reference signal output from the reference signal generating section;
a counter section that receives a count clock for AD conversion and performs a count operation on the basis of a comparison result of the comparing section;
a count operation period control section that controls an operation period of the counter section in each processing period on the basis of the comparison result of the comparing section; and
a control section that controls the reference signal generating section and the counter section,
wherein the control section controls the reference signal generating section such that the inclination of the reference signal per unit time in a processing period of a reference side supplied for differential processing is larger than that in a processing period of a side including a difference acquired in the differential processing.

10. An AD converter comprising:
a reference signal generating section that generates a reference signal whose level changes gradually;
a comparing section that compares an analog signal to be processed with the reference signal output from the reference signal generating section;
a counter section that receives a count clock for AD conversion and performs a count operation on the basis of a comparison result of the comparing section;
a count operation period control section that controls an operation period of the counter section in each processing period on the basis of the comparison result of the comparing section; and
a control section that controls the reference signal generating section and the counter section,
wherein the control section controls the counter section such that a processing period of a reference side supplied for differential processing is changed according to a set value of an AD conversion gain and a frequency of a count clock for AD conversion in a processing period of the reference side and a processing period of the side including the difference acquired in the differential processing is constant regardless of the set value of the AD conversion gain, and controls the reference signal generating section such that the inclination of the reference signal per unit time in the processing period of the reference side is equal to the inclination of the reference signal per unit time in the processing period of the side including the difference regardless of the set value of the AD conversion gain.

11. An AD conversion method comprising the steps of:
comparing a reference signal whose level changes gradually with an analog signal to be processed using a comparing section;
receiving a count clock for AD conversion and performing a count operation on the basis of a result of the comparison using a counter section; and
acquiring digital data of the signal to be processed on the basis of output data of the counter section,
wherein the inclination of the reference signal per unit time in a processing period of a reference side supplied for differential processing is set to be larger than that in a processing period of a side including a difference acquired in the differential processing.

12. An AD conversion method comprising the steps of:
comparing a reference signal whose level changes gradually with an analog signal to be processed using a comparing section;
receiving a count clock for AD conversion and performing a count operation on the basis of a result of the comparison using a counter section; and
acquiring digital data of the signal to be processed on the basis of output data of the counter section,
wherein a processing period of a reference side supplied for differential processing is changed according to a set value of an AD conversion gain and a frequency of a count clock for AD conversion in a processing period of the reference side and a processing period of the side including the difference acquired in the differential processing is set constant regardless of the set value of the AD conversion gain, and
the inclination of the reference signal per unit time in the processing period of the reference side is set to be equal to the inclination of the reference signal per unit time in the processing period of the side including the difference regardless of the set value of the AD conversion gain.

* * * * *